US012625366B2

(12) United States Patent　　　　　(10) Patent No.:　US 12,625,366 B2
Kong et al.　　　　　　　　　　　　(45) Date of Patent:　　May 12, 2026

(54) DISPLAY DEVICE, AUGMENTED REALITY DEVICE INCLUDING DISPLAY DEVICE, AND METHOD OF MANUFACTURING DISPLAY DEVICE

(71) Applicant: SAMSUNG ELECTRONICS CO., LTD., Suwon-si (KR)

(72) Inventors: Kiho Kong, Suwon-si (KR); Junhee Choi, Seongnam-si (KR); Junghun Park, Yongin-si (KR); Eunsung Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 914 days.

(21) Appl. No.: 17/877,402

(22) Filed: Jul. 29, 2022

(65) Prior Publication Data

US 2023/0221552 A1　　Jul. 13, 2023

(30) Foreign Application Priority Data

Jan. 10, 2022　(KR) ........................ 10-2022-0003567
May 18, 2022　(KR) ........................ 10-2022-0061031

(51) Int. Cl.
　*G02B 27/01*　　　(2006.01)
　*H10H 29/14*　　　(2025.01)
　　　　(Continued)
(52) U.S. Cl.
　CPC ..... *G02B 27/0101* (2013.01); *G02B 27/0172* (2013.01); *H10H 29/142* (2025.01);
　　　　(Continued)
(58) Field of Classification Search
　CPC ......... H10H 20/8513; H10H 29/30–49; H10H 20/853; H10H 29/8517; H01L 25/0753; H10K 59/38
　See application file for complete search history.

(56) References Cited

U.S. PATENT DOCUMENTS 7,819,539 B2　10/2010　Kim et al.
9,484,504 B2　11/2016　Bibl et al.
　　　(Continued)

FOREIGN PATENT DOCUMENTS

JP　　　2021-117249 A　　8/2021
KR　10-2014-0042274 A　　4/2014
　　　(Continued)

OTHER PUBLICATIONS

Communication issued Jan. 12, 2026 by the Korean Ministry of Intellectual Property in Korean Patent Application No. 10-2022-0061031.

*Primary Examiner* — Christine S. Kim
*Assistant Examiner* — Andrew Victor Prostor
(74) *Attorney, Agent, or Firm* — Sughrue Mion, PLLC

(57)　　　　ABSTRACT

A display device includes: a plurality of light emitting elements including a first semiconductor layer, each of the plurality of light emitting elements including a second semiconductor layer provided under the first semiconductor layer and an active layer between the first semiconductor layer and the second semiconductor layer; a plurality of partition walls extending from the first semiconductor layer; and a plurality of color conversion layers provided on the plurality of light emitting elements in correspondence with the plurality of light emitting elements and spaced apart from each other by the plurality of partition walls, each of the plurality of color conversion layers including a first color conversion layer and a second color conversion layer stacked on the first color conversion layer.

19 Claims, 23 Drawing Sheets

(51) Int. Cl.

|  |  |
|---|---|
| *H10H 20/851* | (2025.01) |
| *H10H 20/855* | (2025.01) |
| *H10H 29/30* | (2025.01) |
| *H10K 59/38* | (2023.01) |

(52) U.S. Cl.

CPC . *G02B 2027/0178* (2013.01); *H10H 20/8513* (2025.01); *H10H 20/8515* (2025.01); *H10H 20/855* (2025.01); *H10H 29/30* (2025.01); *H10K 59/38* (2023.02)

(56) References Cited

U.S. PATENT DOCUMENTS

| | | | | |
|---|---|---|---|---|
| 2010/0103648 | A1* | 4/2010 | Kim | H10H 20/8515 |
| | | | | 257/E33.061 |
| 2017/0309798 | A1* | 10/2017 | Bonar | H10H 20/825 |
| 2020/0168663 | A1* | 5/2020 | Choi | H10H 20/833 |
| 2021/0159278 | A1 | 5/2021 | Lee et al. | |
| 2021/0175278 | A1 | 6/2021 | Lo et al. | |
| 2021/0288105 | A1* | 9/2021 | Kawanishi | G09G 3/32 |
| 2021/0399040 | A1* | 12/2021 | Chai | H10H 20/831 |
| 2022/0208849 | A1* | 6/2022 | Lee | H10H 20/8515 |
| 2022/0352245 | A1* | 11/2022 | Seo | H10H 20/851 |

FOREIGN PATENT DOCUMENTS

| | | | |
|---|---|---|---|
| KR | 10-1577300 | B1 | 12/2015 |
| KR | 10-2019-0052582 | A | 5/2019 |
| KR | 10-2020-0062863 | A | 6/2020 |
| KR | 10-2021-0065245 | A | 6/2021 |
| KR | 10-2021-0070926 | A | 6/2021 |

* cited by examiner

1

DISPLAY DEVICE, AUGMENTED REALITY DEVICE INCLUDING DISPLAY DEVICE, AND METHOD OF MANUFACTURING DISPLAY DEVICE

CROSS-REFERENCE TO RELATED APPLICATION

This application is based on and claims priority under 35 U.S.C. § 119 to Korean Patent Application Nos. 10-2022-0003567, filed on Jan. 10, 2022, and 10-2022-0061031, filed on May 18, 2022, in the Korean Intellectual Property Office, the disclosure of which is incorporated by reference herein in its entirety.

BACKGROUND

1. Field

The present disclosure relates to display devices, augmented reality devices including the display devices, and methods of manufacturing the display devices, and more particularly, to high resolution display devices using a micro-light emitting diode (LED), augmented reality devices including the display devices, and methods of manufacturing the display devices.

2. Description of the Related Art

A flat panel display such as a liquid crystal display (LCD) or an organic light emitting diode display (OLED) have been widely used as a display device. Light emitting diodes (LED) included in various types of display devices have advantages of low power consumption and environment friendliness. Accordingly, industrial demand for LEDs have been increased.

Recently, technologies of fabricating high resolution display devices by using a micro-LED have been expanding remarkably. However, fabrication of high-resolution display devices by using a micro-LED requires high efficiency micro-LED chips. Moreover, a high-level transfer technology is essential to properly arrange the micro-LED chips. A pick and place method is known as a method of transferring the micro-LED chips.

SUMMARY

Example embodiments provide methods of manufacturing a display device having an improved process yield. Example embodiments also provide a method of manufacturing a display device by patterning a color conversion layer without using a mask, thereby reducing production expenses.

Example embodiments also provide methods of manufacturing a display device capable of simplifying designs of a scan driver and a data driver, which are used for control of operations of a plurality of active layers by employing a method of simultaneously driving the plurality of active layers in the process of patterning the color conversion layer without using a mask.

Example embodiments also provide methods of manufacturing a display device which minimizes residues left after the patterning of the color conversion layer.

Example embodiments also provide high resolution display devices using a micro-LED.

Additional aspects will be set forth in part in the description which follows and, in part, will be apparent from the description, or may be learned by practice of the presented embodiments of the disclosure.

According to an aspect of an example embodiment, a display device includes: a plurality of light emitting elements including a first semiconductor layer, each of the plurality of light emitting elements including a second semiconductor layer provided under the first semiconductor layer and an active layer between the first semiconductor layer and the second semiconductor layer; a plurality of partition walls extending from the first semiconductor layer; and a plurality of color conversion layers provided on the plurality of light emitting elements in correspondence with the plurality of light emitting elements and spaced apart from each other by the plurality of partition walls, each of the plurality of color conversion layers including a first color conversion layer and a second color conversion layer stacked on the first color conversion layer.

The first semiconductor layer may include an upper surface, a lower surface opposite to the upper surface, the plurality of partition walls protruding and extending from the upper surface, and a plurality of opening areas provided between the plurality of partition walls.

The active layer of each of the plurality of light emitting elements faces a corresponding opening area of the plurality of opening areas on the lower surface of the first semiconductor layer, and in each of the plurality of light emitting elements, the second semiconductor layer is provided under the active layer.

The display device may further include a plurality of separation films respectively provided between active layers of adjacent light emitting elements of the plurality of light emitting elements and between second semiconductor layers of the adjacent light emitting elements.

The first color conversion layer of each of the plurality of color conversion layers may be provided in a corresponding opening area of the plurality of opening areas on the upper surface of the first semiconductor layer, and the second color conversion layer of each of the plurality of color conversion layers is provided on the corresponding first color conversion layer and may include a material different from that of the first color conversion layer.

A material of the plurality of partition walls may be the same as a material of the first semiconductor layer, and the plurality of partition walls may extend in an integrated manner from the upper surface of the first semiconductor layer.

The display device may further include a common electrode provided on an upper surface of each of the plurality of partition walls.

The common electrode may include an opaque metallic material.

The display device may further include a light shielding film provided on lateral surfaces of the plurality of partition walls.

In the plurality of opening areas, the upper surface of the first semiconductor layer may have a light extraction pattern.

The display device may further include a plurality of reflection electrodes respectively electrically connected to the second semiconductor layer of each of the plurality of light emitting elements.

The first semiconductor layer may be doped with a dopant having a first conductivity type, and the second semiconductor layer of each of the plurality of light emitting elements may be doped with a dopant having a second conductivity type which is electrically opposite to the first conductivity type.

A distance between two adjacent partition walls of the plurality of partition walls may be greater than a width of the active layer of each of the plurality of light emitting elements.

A width of the active layer of each of the plurality of light emitting elements may be between 0.1 μm and 100 μm.

A sum of a height of the first color conversion layer of each of the plurality of color conversion layers and a height of the second color conversion layer of each of the plurality of color conversion layers may be less than a height of each of the plurality of partition walls.

Each of the first color conversion layer of each of the plurality of color conversion layers and the second color conversion layer of each of the plurality of color conversion layers may include a photoresist and quantum dots or phosphors dispersed in the photoresist.

The display device may further include a plurality of color filters respectively provided on the plurality of color conversion layers.

The display device may further include an insulating layer covering each of the plurality of color filters and having a light penetrability with respect to light emitted from the plurality of color conversion layers.

The display device may further include a switching circuit configured to simultaneously operate at least a portion of active layers of the plurality of light emitting elements.

According to an aspect of an example embodiment, a augmented reality device includes: a projection system including a display configured to generate an image; and an optical system configured to guide the image generated from the projection system to eyes of a user, wherein the display includes: a plurality of light emitting elements including a first semiconductor layer, each of the plurality of light emitting elements including a second semiconductor layer provided under the first semiconductor layer and an active layer between the first semiconductor layer and the second semiconductor layer; a plurality of partition walls extending from the first semiconductor layer; and a plurality of color conversion layers provided on the plurality of light emitting elements in correspondence with the plurality of light emitting elements and spaced apart from each other by the plurality of partition walls, each of the plurality of color conversion layers including a first color conversion layer and a second color conversion layer stacked on the first color conversion layer.

According to an aspect of an example embodiment, a method of manufacturing a display device, includes: forming a plurality of light emitting elements by forming a first semiconductor layer, an active layer, and a second semiconductor layer on a growth substrate; forming a separation film separating the second semiconductor layer and the active layer into a plurality of second semiconductor layers and a plurality of active layers, respectively; removing the growth substrate; forming a common electrode patterned on a surface of the first semiconductor layer exposed by removing the growth substrate; forming a plurality of partition walls by etching a part of the first semiconductor layer not covered by the common electrode; forming a plurality of first color conversion layers in a plurality of opening areas between the plurality of partition walls; and forming a plurality of second color conversion layers on the plurality of first color conversion layers, the plurality of second color conversion layers including a material different from a material of the plurality of first color conversion layers, wherein the plurality of partition walls are formed so that the plurality of active layers face the plurality of opening areas.

The forming of the plurality of partition walls may include: forming the plurality of partition walls having inclined lateral walls via dry etching; increasing an inclination of the inclined lateral walls of the plurality of partition walls via wet etching; and forming a light shielding film on a lateral surface of each of the plurality of partition walls.

The method may further include forming a light extraction pattern on a surface of the first semiconductor layer in the plurality of opening areas formed between the plurality of partition walls during the wet etching.

The forming of the plurality of first color conversion layers may include: forming a first color conversion layer material on the plurality of partition walls and the plurality of opening areas arranged between the plurality of partition walls, the first color conversion layer material including a photoresist and quantum dots or phosphors dispersed in the photoresist; hardening a part of the first color conversion layer material by simultaneously operating the plurality of active layers and irradiating light to the first color conversion layer material; and forming the plurality of first color conversion layers filling a portion in the plurality of opening areas and being arranged in areas respectively corresponding to the plurality of active areas by removing an unhardened part of the first color conversion layer material.

The forming of the plurality of second color conversion layers may include: forming a second color conversion layer material on the plurality of first color conversion layers, the second color conversion layer material including a photoresist and quantum dots or phosphors dispersed in the photoresist; hardening a part of the second color conversion layer material by simultaneously operating the plurality of active layers and irradiating the second color conversion layer material with light; and forming the plurality of second color conversion layers filling another portion in the plurality of opening areas and respectively arranged on the plurality of first color conversion layers by removing an unhardened part of the second color conversion layer material.

The method may further include forming a plurality of color filters on the plurality of second color conversion layers.

The method may further include forming an insulating layer covering each of the plurality of color filters and having a light penetrability with respect to light emitted from the plurality of first color conversion layers and the plurality of second color conversion layers.

The method may further include forming a plurality of reflection electrodes electrically connected to the plurality of second semiconductor layers before removing the growth substrate.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
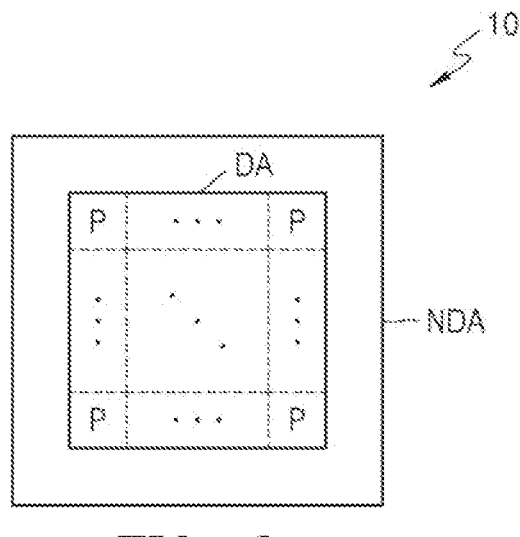
FIG. 1 is a schematic conceptual diagram of a display device according to an example embodiment.

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the drawings, sizes or thicknesses of components may be exaggerated for clarity of explanation.

While such terms as "first," "second," etc., may be used to describe various components, such components must not be limited to the above terms. The above terms are used only to distinguish one component from another.

An expression used in the singular encompasses the expression of the plural, unless it has a clearly different meaning in the context.

When a portion "includes" an element, another element may be further included, rather than excluding the existence of the other element, unless otherwise described.

The use of the terms "a" and "an" and "the" and similar referents in the context of describing example embodiments (especially in the context of the following claims) are to be construed to cover both the singular and the plural. The use of any and all examples, or exemplary language provided herein, is intended merely to better illuminate example embodiments and does not pose a limitation on the scope of example embodiments unless otherwise claimed.

Figure 2:
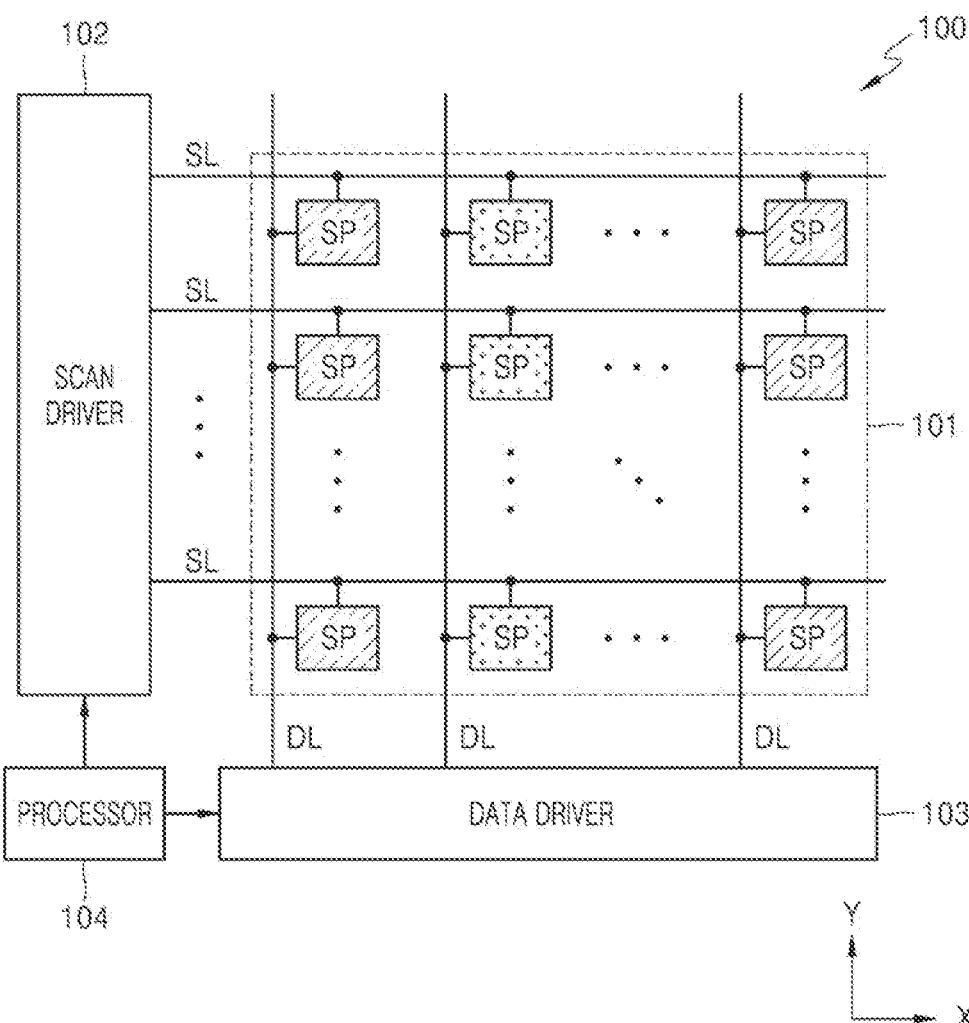
FIG. 2 is a schematic circuit diagram of a display device according to an example embodiment.

FIG. 1 is a schematic conceptual diagram of a display device 100 according to an example embodiment. FIG. 2 is a schematic circuit diagram of the display device 100 according to an example embodiment.

With reference to FIGS. 1 and 2, the display device 100 may be divided into a display area DA and a non-display area NDA. The display area DA is an area in which an image is displayed. The display area DA may include a plurality of pixels P to display an image. The plurality of pixels P may be arranged in a two-dimensional (2D) array in the display area DA. Each of the plurality of pixels P may include a subpixel SP each emitting different colors.

Moreover, the display device 100 may include a pixel array 101, a scan driver 102, a data driver 103, and a processor 104. The pixel array 101 may be arranged in the display area DA of the display device 100. On the contrary, the scan driver 102, the data driver 103, and the processor 104 may be arranged in the non-display area NDA of the display device 100.

The pixel array 101 may include a plurality of pixels P arranged in a 2D array or a plurality of subpixels SP, a plurality of scan lines SL transmitting a scan signal to the plurality of pixels P or the plurality of subpixels SP, and a plurality of data lines DL transmitting a data signal to the plurality of pixels P or the plurality of subpixels SP. The plurality of scan lines SL may extend towards the scan driver 102 to receive a scan signal from the scan driver 102, and the plurality of data lines DL may extend towards the data driver 103 to receive a data signal from the data driver 103.

The plurality of scan lines SL and the plurality of data lines DL may extend in a direction in which the plurality of scan lines SL intersect with the plurality of data lines DL. FIG. 2 illustrates that the plurality of scan lines SL extend in an X direction and the plurality of data lines DL extend in a Y direction; however, the present disclosure is not limited thereto, and the extension directions of the plurality of data lines DL and the plurality of scan lines SL may be switched. Each of the subpixels SP may be arranged in positions where the plurality of scan lines SL intersect with the plurality of data lines DL.

Each of the plurality of subpixels SP may include a light emitting element and a driver transistor to drive the light emitting element. The light emitting element may be a micro light emitting element having a micro size. For example, the light emitting element may have a size of 0.1 μm to 100 μm. According to an example embodiment, the light emitting element and the driver transistor may be formed together on one growth substrate.

FIGS. 3 to 20 are cross-section views schematically illustrating a manufacturing process of a display device according to an example embodiment.

Figure 3:
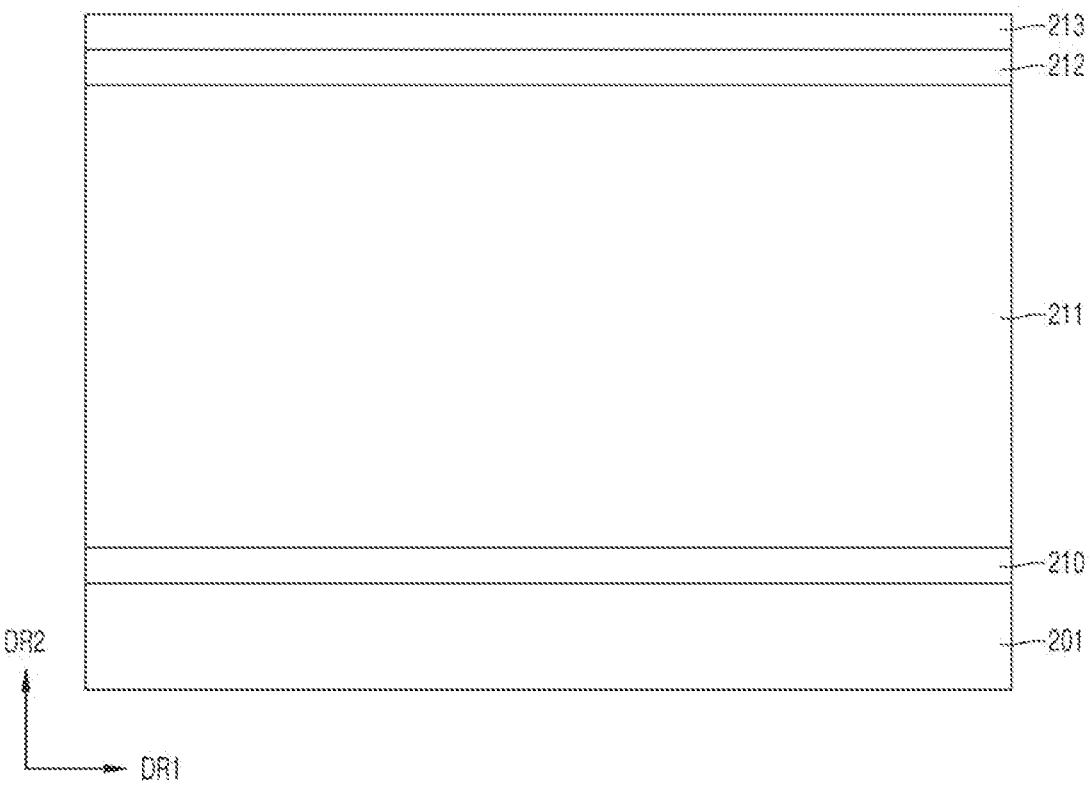
FIGS. 3 to 20 are cross-section views schematically illustrating an example of a manufacturing process of a display device according to an example embodiment.

First, with reference to FIG. 3, a first buffer layer 210 may be formed on a growth substrate 201. The growth substrate 201 may include, for example, silicon, sapphire, or GaAs. The first buffer layer 210 may be grown to have a crystalloid by using a chemical vapor deposition (CVD) process, a physical vapor deposition (PVD) process, or an atomic layer deposition (ALD) process. The first buffer layer 210 may be provided to relax stress due to a lattice constant difference between the growth substrate 201 and a first semiconductor layer 211 described below. To this end, a lattice constant of the first buffer layer 210 may have a value between a lattice constant of the growth substrate 201 and a lattice constant of the first semiconductor layer 211, or have the same value as the lattice constant of the first semiconductor layer 211. The first buffer layer 210 may include group III-V compound semiconductors, such as GaN, GaP, GaAs, etc. Furthermore, the first buffer layer 210 may be doped with a dopant having the same conductivity type as the first semiconductor layer 211. For example, when the first semiconductor layer 211 is doped with an n-type dopant, the first buffer layer 210 may include n-GaN, n-GaP, or n-GaAs, and when the first semiconductor layer 211 is doped with a p-type dopant, the first buffer layer 210 may include p-GaN, p-GaP, or p-GaAs.

The first semiconductor layer 211, an active layer 212, and a second semiconductor layer 213 may be formed sequentially on the first buffer layer 210. The first semiconductor layer 211 may be doped with a dopant having the first conductivity type, and the second semiconductor layer 213 may be doped with a dopant having the second conductivity type, which is electrically opposite to the first conductivity type. For example, when the first semiconductor layer 211 is doped with the n-type dopant, the second semiconductor layer 213 may be doped with the p-type dopant, or when the first semiconductor layer 211 is doped with the p-type dopant, the second semiconductor layer 213 may be doped with the n-type dopant. The active layer 212 may not be doped. The first semiconductor layer 211, the active layer 212, and the second semiconductor layer 213 may include, for example, group III-V compound semiconductors, such as GaN, InGaN, AlGaInN, AlGaInP, etc.

The active layer 212 may generate light by recombining an electron and a hole provided from the first semiconductor layer 211 and the second semiconductor layer 213. To this end, the active layer 212 may have a quantum well structure in which a quantum well is arranged between walls. A wavelength of light generated at the active layer 212 may be determined according to an energy bandgap of a material constituting the quantum well in the active layer 212. The active layer 212 may have only one quantum well, but also may have a multi-quantum well structure in which a plurality of quantum wells and a plurality of walls are arranged alternately. In conduction band, energy of the quantum well may be selected to be lower than energy of the wall. To this end, the wall and the quantum well in the active layer 212 may include different compound semiconductors or a compound semiconductor having different compositions.

Figure 4:
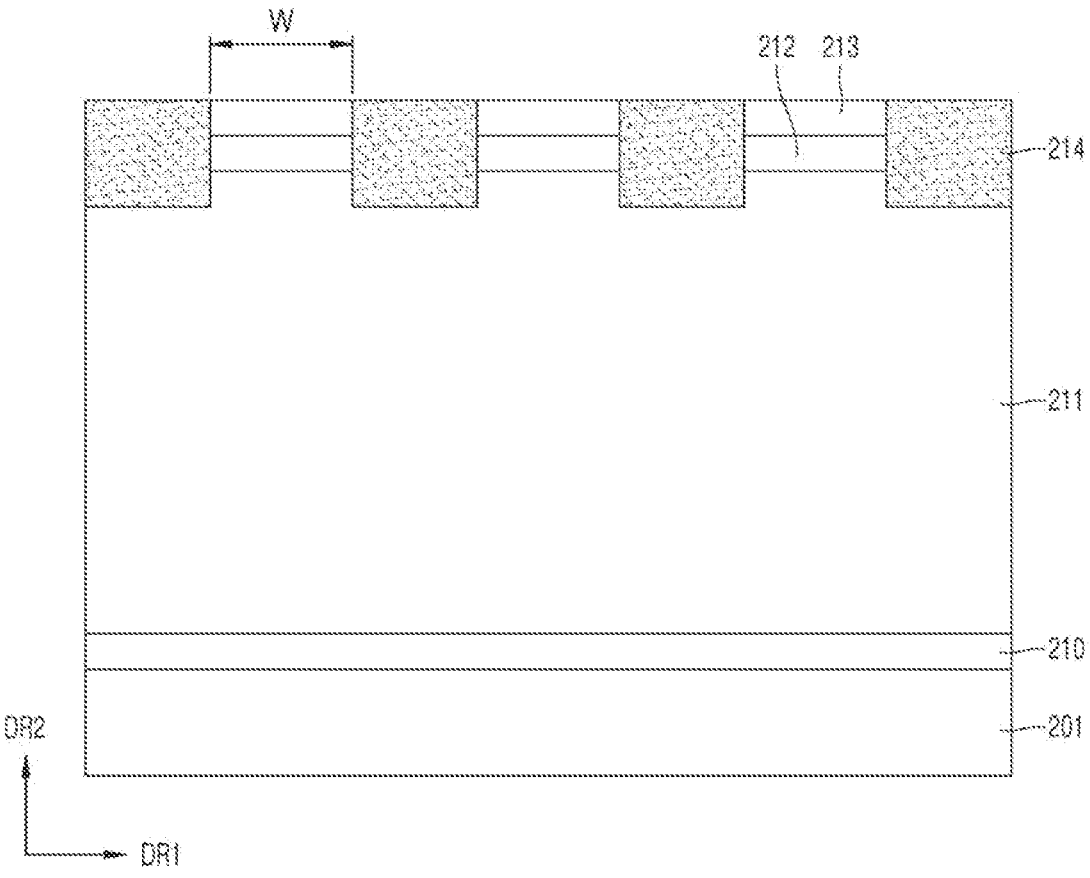

With reference to FIG. 4, a separation film 214 separating the second semiconductor layer 213 and the active layer 212 into a plurality of second semiconductor layers 213 and a plurality of active layers 212, respectively may be formed. The separation film 214 may be formed by injecting impurities into the second semiconductor layer 213 and the active layer 212 through, for example, an ion implantation process. For example, the impurities may include argon (Ar). The separation film 214 formed by the foregoing process may have electrical insulating properties. FIG. 4 illustrates that a plurality of separation films 214 are arranged at certain regular intervals in a first direction DR1 parallel with an upper surface of the growth substrate 201; however, the separation film 214 may be a single layer having a mesh structure, and the plurality of active layers 212 and the plurality of second semiconductor layers 213 may be arranged in a 2D manner. The plurality of second semiconductor layers 213 may be electrically separated from each other by the separation film 214, and the plurality of active layers 212 may be electrically separated from each other by the separation film 214. To ensure the electrical separation among the plurality of active layers 212, the separation film 214 may extend to a part of the first semiconductor layer 211. In other words, a thickness of the separation film 214 may be greater than or equal to a sum of a thickness of the active layer 212 and a thickness of the second semiconductor layer 213.

The plurality of second semiconductor layers 213 and the plurality of active layers 212 may constitute a plurality of light emitting elements together with the plurality of first semiconductor layer 211. In this case, the first semiconductor layer 211 included in the plurality of light emitting elements may be formed in an integrated manner. Accordingly, the plurality of light emitting elements may share with each other a single first semiconductor layer 211. The plurality of light emitting elements may be, for example, a micro light emitting element having a micro-size, in particular, a micro light emitting diode (LED). For example, a gap between two adjacent separation films 214 in the first direction DR1, or a width W of each of the plurality of active layers 212 in the first direction DR1, or a width W of each of the plurality of second semiconductor layers 213 in the first direction DR1 may be within a range from about 0.1 μm to about 100 μm.

Figure 5:
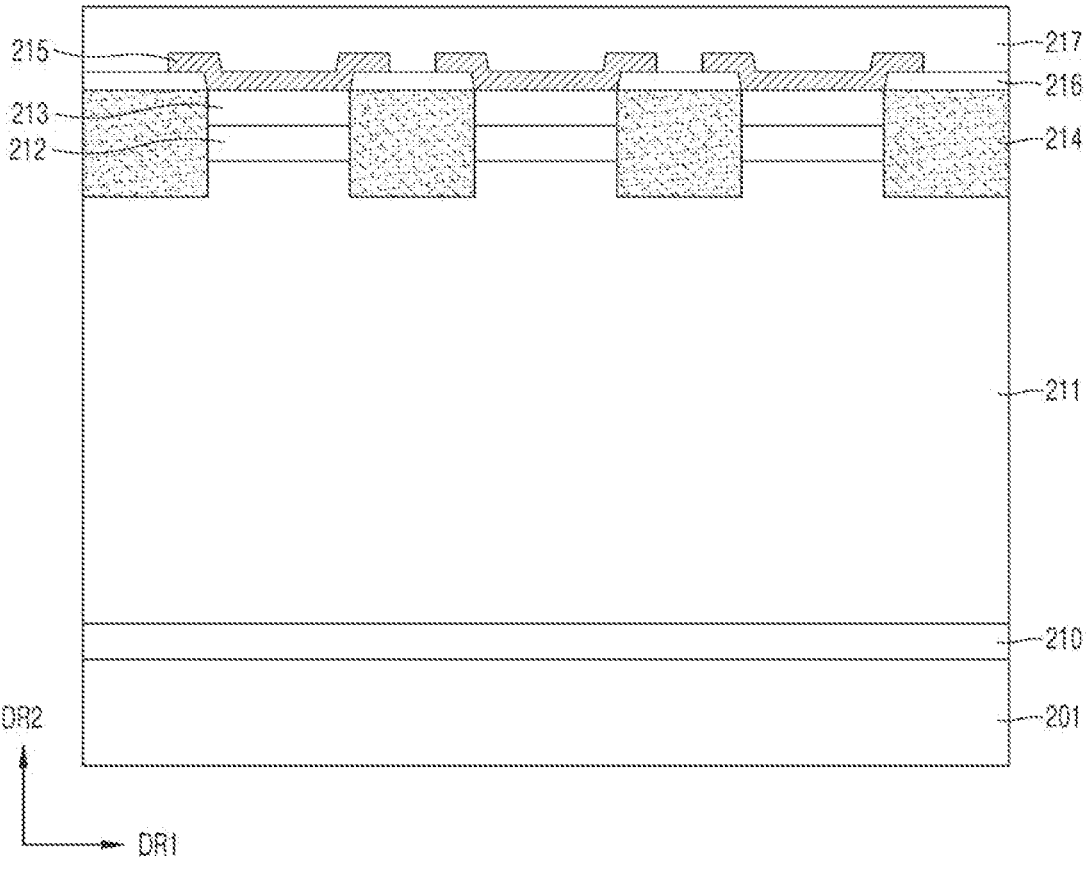

With reference to FIG. 5, a passivation layer 216 may be formed on the separation film 214. For example, after forming a passivation layer material to cover the plurality of second semiconductor layers 213 and the separation film 214, the plurality of second semiconductor layers 213 may be exposed to outside trough a patterning process to form the passivation layer 216. The passivation layer 216 may include an insulating material. For example, the passivation layer 216 may include $SiO_2$, $Al_2O_3$, SiN, AlN, or a combination thereof.

Then, a plurality of reflection electrodes 215 may be respectively formed on the plurality of second semiconductor layers 213. The plurality of reflection electrodes 215 may be formed by, for example, after forming a reflection electrode material to cover all of the plurality of second semiconductor layers 213 and the passivation layer 216, exposing the passivation layer 216 to the outside through the patterning process. Each of the plurality of reflection electrodes 215 may further extend to a part of an upper surface of the passivation layer 216. The plurality of reflection electrodes 215 may include a metallic material having reflectability with respect to light generated at the active layer 212. For example, the plurality of reflection electrodes 215 may include at least one of silver (Ag), aluminum (Al), indium (In), titanium (Ti), nickel (Ni), copper (Cu), chrome (Cr), gold (Au), palladium (Pd), tungsten (W), and platinum (Pt), or an alloy thereof. The plurality of reflection electrodes 215 may be electrically connected to a second semiconductor layer among the plurality of second semiconductor layers 213. Although it is not shown in the drawings, a contact layer to provide an ohmic contact may be further arranged between the reflection electrode 215 and the second semiconductor layer 213.

Moreover, a first insulating layer 217 may be formed on the plurality of reflection electrodes 215 and the passivation layer 216. The first insulating layer 217 may be formed through the CVD process, the PVD process, or the ALD process. The first insulating layer 217 may extend in the first direction DR1. The first insulating layer 217 may completely cover the plurality of reflection electrodes 215 and the passivation layer 216. The first insulating layer 217 may include, for example, $SiO_2$, $Al_2O_3$, SiN, AlN, or a combination thereof.

Figure 6:
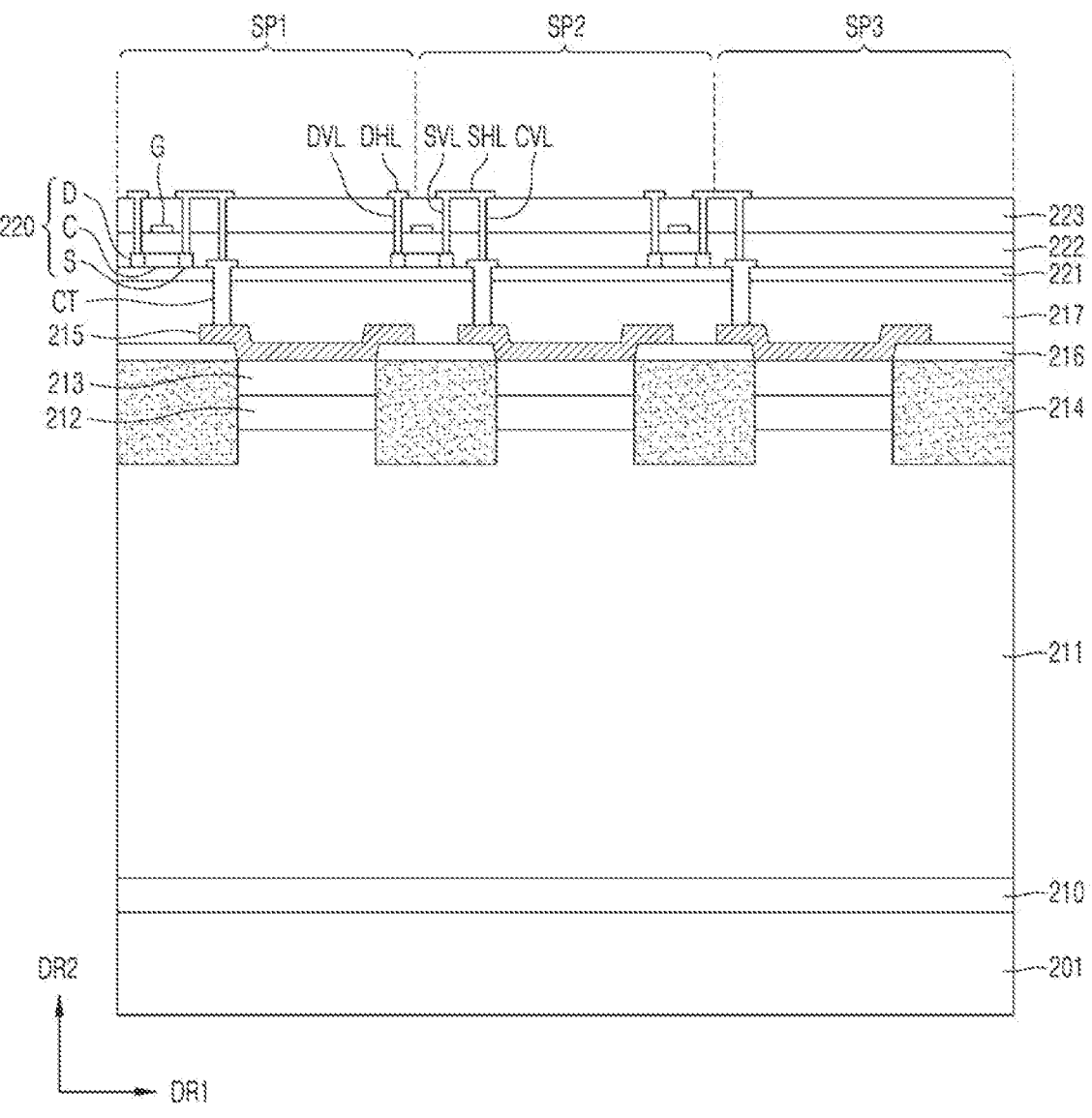

With reference to FIG. 6, a second buffer layer 221 may be formed on the first insulating layer 217. The second buffer layer 221 may be formed through the CVD process, the PVD process, or the ALD process. The second buffer layer 221 may include an insulating material. For example, the second buffer layer 221 may include $SiO_2$, $Al_2O_3$, SiN, AlN, or a combination thereof. The second buffer layer 221 may function as a growth substrate to form a semiconductor pattern 220 described below.

Furthermore, a plurality of contacts CT passing through the second buffer layer 221 and the first insulating layer 217 may be formed. The plurality of contacts CT may be respectively electrically connected to the plurality of reflection electrodes 215. For example, the plurality of contacts CT may respectively in direct contact with the plurality of reflection electrodes 215. The plurality of contacts CT may be formed by, after forming a plurality of openings (not shown) exposing each of the plurality of reflection electrodes 215 and passing through the second buffer layer 221 and the first insulating layer 217, filling the plurality of openings with a conductive material. Although the drawings illustrate that a conductive material is the openings completely, such illustration is merely an example. For example, a part of the conductive material may extend along a surface of the second buffer layer 221 and the first insulating layer 217 exposed by the plurality of openings, and may not fill the openings completely. An upper portion of the plurality of contacts CT may be exposed to the second buffer layer 221.

A plurality of semiconductor patterns 220 may be formed on the second buffer layer 221. Each of the plurality of semiconductor patterns 220 may include a source area S, a drain area D, and a channel area C. The plurality of semiconductor patterns 220 may be formed by forming a plurality of amorphous semiconductor patterns on the second buffer layer 221, and irradiating laser to both ends of each of the plurality of amorphous semiconductor patterns for crystallization. For example, the plurality of amorphous semiconductor patterns may include amorphous silicon. The crystallized both ends of the plurality of semiconductor patterns 220 may be defined as the source area S and the drain area D. A part between the both ends of each of the plurality of semiconductor patterns 220 may be amorphous. The amorphous part of the plurality of semiconductor patterns 220 may be defined as the channel area C. Each of the plurality of semiconductor patterns 220 may be respectively provided on the plurality of separation films 214 corresponding thereto. In other words, each of the plurality of semiconductor patterns 220 may overlap a corresponding separation film 214 in a second direction DR2 perpendicular to an upper surface of the growth substrate 201, and may be arranged not to shade the active layer 212.

A second insulating layer 222 may be formed on the plurality of semiconductor patterns 220, the semiconductor pattern 220, and the plurality of contacts CT. The second insulating layer 222 may be formed through the CVD process, the PVD process, or the ALD process. The second insulating layer 222 may extend in the first direction DR1. The second insulating layer 222 may include $SiO_2$, $Al_2O_3$, SiN, AlN, or a combination thereof. The second insulating layer 222 may function as a gate insulating film.

Moreover, a plurality of gate electrodes G may be formed on the second insulating layer 222. The plurality of gate electrodes G may be formed by forming a gate electrode film (not shown) extending along the second insulating layer 222 and patterning the gate electrode film. The gate electrode film may be formed through the CVD process, the PVD process, or the ALD process. The gate electrode film may include, for example, a conductive material, such as a metal or polysilicon. The plurality of gate electrodes G may be provided at opposites sides of the channel areas C to the second insulating layer 222. In other words, the plurality of gate electrodes G may be arranged to overlap the plurality of channel areas C in the second direction DR2.

A third insulating layer 223 may be formed on the plurality of gate electrodes G and the second insulating layer 222. The third insulating layer 223 may be formed through the CVD process, the PVD process, or the ALD process. The third insulating layer 223 may extend in the first direction DR1. The third insulating layer 223 may include $SiO_2$, $Al_2O_3$, SiN, AlN, or a combination thereof.

Then, a plurality of drain vertical lines DVL passing through the second insulating layer 222 and the third insulating layer 223 may be formed. The plurality of drain vertical lines DVL may include, for example, a conductive material, such as a metal. The plurality of drain vertical lines DVL may be formed by forming a plurality of openings respectively passing through the second insulating layer 222 and the third insulating layer 223 and exposing the plurality of drain areas D and providing a conductive material in the plurality of openings. The drawings illustrate that the plurality of openings are completely with the conductive material; however, such illustration is merely as example. For example, the conductive material may extend along a surface of the second insulating layer 222 and the third insulating layer 223 exposed by the plurality of openings, and may not fill the plurality of openings completely. Each of the plurality of drain vertical lines DVL may be respectively electrically connected to the plurality of drain areas D. For example, the plurality of drain vertical lines DVL may respectively be in direct contact with each of the plurality of drain areas D corresponding thereto.

A plurality of drain horizontal lines DHL may respectively be arranged on the plurality of drain vertical lines DVL. The plurality of drain horizontal lines DHL may be formed along with the plurality of drain vertical lines DVL when the plurality of drain vertical lines DVL are formed. For example, when providing a conductive material in the plurality of openings for formation of the plurality of drain vertical lines DVL, the conductive material may be provided on an upper surface of the third insulating layer 223. The conductive material which is provided on the upper surface of the third insulating layer 223 and is in direct contact with the plurality of drain vertical lines DVL may be defined as the plurality of drain horizontal lines DHL. The plurality of drain areas D may be electrically connected to the data driver 103 described with reference to FIGS. 1 and 2 by the plurality of drain vertical lines DVL and the plurality of drain horizontal lines DHL.

Furthermore, a plurality of source vertical lines SVL and a plurality of contact vertical lines CVL passing through the second insulating layer 222 and the third insulating layer 223 may be formed. The plurality of source vertical lines SVL and the plurality of contact vertical lines CVL may be formed along with the plurality of drain vertical lines DVL when the plurality of drain vertical lines DVL are formed. The plurality of source vertical lines SVL and the plurality of contact vertical lines CVL may include a conductive material, such as a metal. The plurality of source vertical lines SVL and the plurality of contact vertical lines CVL may be formed by forming a plurality of openings passing through the second insulating layer 222 and the third insulating layer 223 and exposing each of the plurality of source area S and the plurality of contacts CT and providing a conductive material in the plurality of openings. The drawings illustrate that the plurality of openings are filled completely with the conductive material; however, such illustration is merely as example. For example, the conductive material may extend along a surface of the second insulating layer 222 and the third insulating layer 223 exposed by the plurality of openings, and may not fill the plurality of openings completely. Each of the plurality of source vertical lines SVL may be respectively electrically connected to the plurality of source areas S. For example, the plurality of source vertical lines SVL may respectively be in direct contact with each of the plurality of source areas S corresponding thereto. Furthermore, each of the plurality of contact vertical lines CVL may be respectively electrically connected to the plurality of contacts CT. For example, the plurality of contact vertical lines CVL may respectively be in direct contact with each of the plurality of contacts CT corresponding thereto.

A plurality of source horizontal lines SHL may respectively be arranged on the plurality of source vertical lines SVL. The plurality of source horizontal lines SHL may be formed along with the plurality of source vertical lines SVL when the plurality of source vertical lines SVL are formed. For example, when providing a conductive material in the plurality of openings for formation of the plurality of source vertical lines SVL, the conductive material may be provided on an upper surface of the third insulating layer 223. The conductive material which is provided on the upper surface of the third insulating layer 223 and is in direct contact with the plurality of source vertical lines SVL may be defined as the plurality of source horizontal lines SHL.

The plurality of source horizontal lines SHL may extend on the plurality of contact vertical lines CVL in the first direction DR1. Each of the plurality of source horizontal lines SHL may electrically connect each of the plurality of source vertical lines SVL to each of the plurality of contact vertical lines CVL, which are adjacent to each other. For, example, both ends of each of the plurality of source horizontal lines SHL may be in direct contact with a source vertical line SVL and a contact vertical line CVL immediately adjacent to each other.

The channel area C, the source area S, the drain area D, and the gate electrode G may constitute a driver transistor. When driving the display device 100, the driver transistor may control a light emission operation of the active layer 212 immediately adjacent thereto. Accordingly, a first subpixel area SP1, a second subpixel area SP2, and a third subpixel area SP3 arranged in the first direction DR1 may be defined. Each of a plurality of driver transistors and the plurality of active layers 212 may respectively be provided to the first to third subpixel areas SP1, SP2, and SP3. Furthermore, a switching circuit (not shown) operating the plurality of active layers 212 simultaneously may be included in the display device 100. For example, the switching circuit may apply an electrical signal to the plurality of driver transistors each including a channel area C, a source area S, a drain area D, and a gate electrode G to simultaneously operate the plurality of active layers 212 respectively connected to the plurality of driver transistors.

Figure 7:
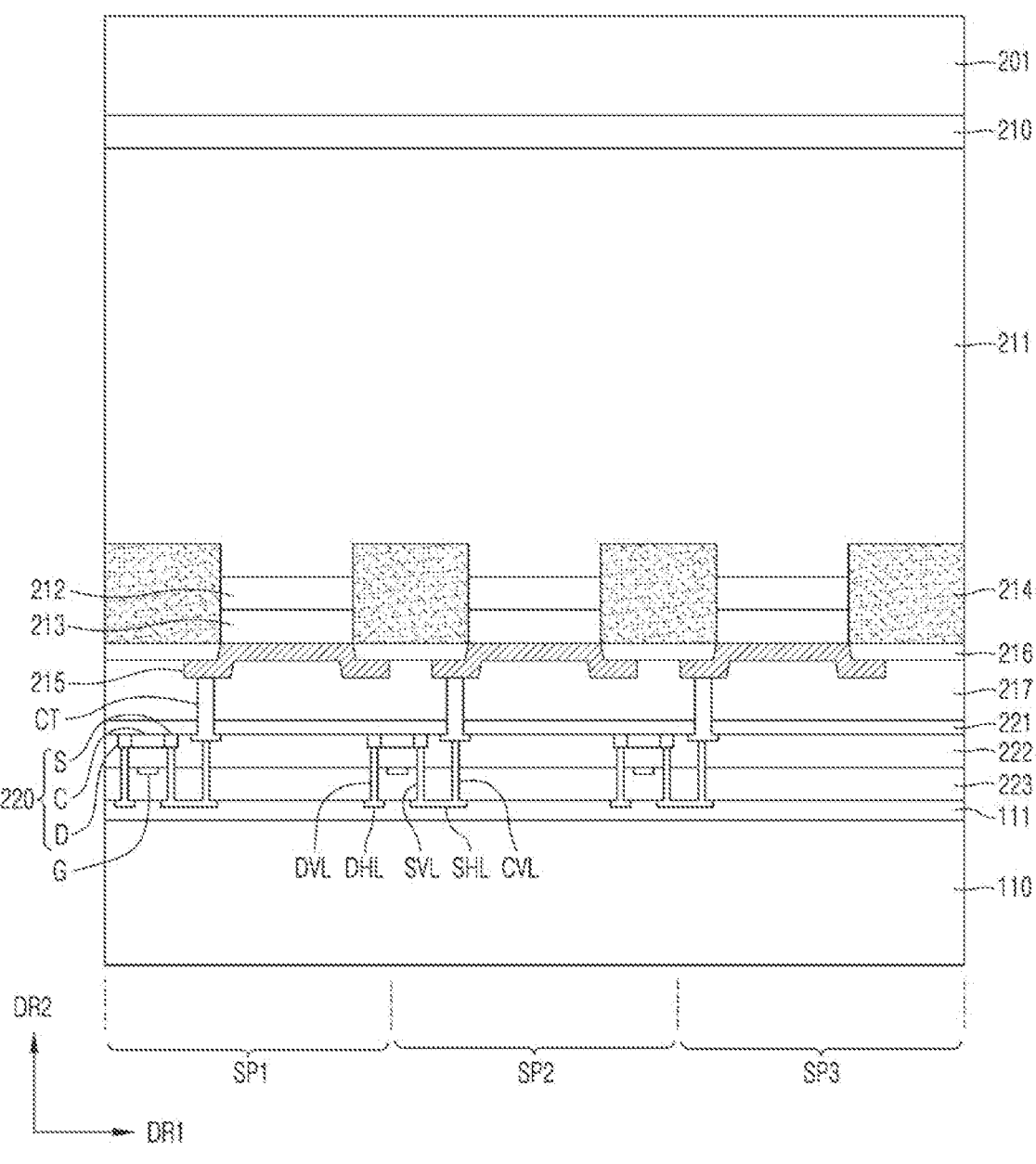

With reference to FIG. 7, the product formed so far may be arranged on a support substrate 110 in a manner that the growth substrate 201 faces upwards. Accordingly, the growth substrate 201 may be arranged at the uppermost portion, and the plurality of drain horizontal lines DHL and the plurality of source horizontal lines SHL may be arranged at the lowermost portion. For convenience in explanation, hereinafter, a second direction DR2 is defined as a direction opposite to the second direction DR2 of FIGS. 3 to 6. In an example embodiment, the support substrate 110 may be in direction contact with the third insulating layer 223, the plurality of drain horizontal lines DHL, and the plurality of source horizontal lines SHL. In another example embodiment, a junction layer 111 may be further provided between the support substrate 110 and the third insulating layer 223, the plurality of drain horizontal lines DHL, and the plurality of source horizontal lines SHL, and the third insulating layer 223, the plurality of drain horizontal lines DHL, and the plurality of source horizontal lines SHL may be fixed on the support substrate 110 through the junction layer 111. The support substrate 110 may be a silicon substrate or a glass substrate.

Figure 8:
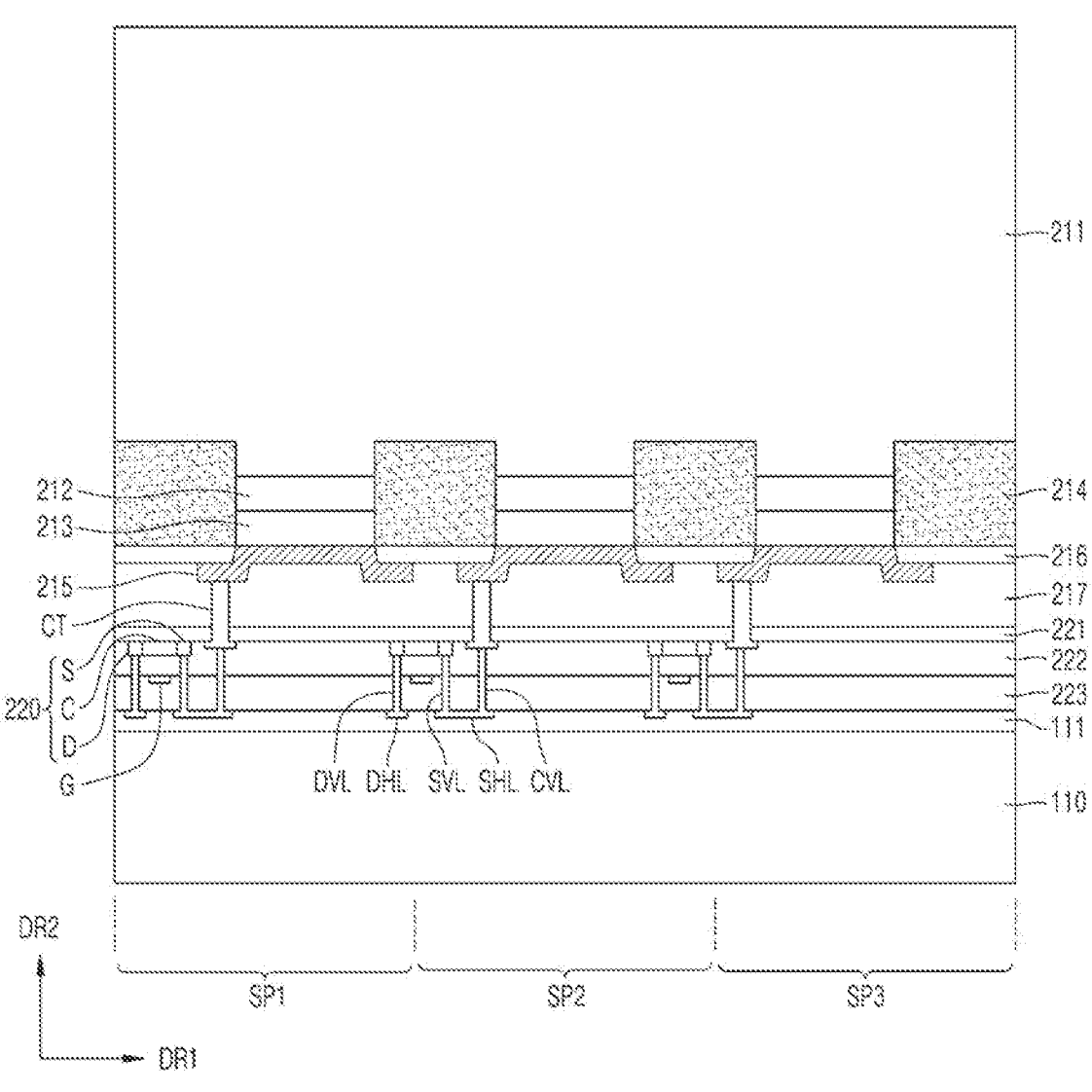

With reference to FIG. 8, the growth substrate 201 may be removed. When the growth substrate 201 is a silicon substrate, the growth substrate 201 may be removed though a polishing process or an etching process. For example, the etching process may be a dry etching process. When the growth substrate is a sapphire substrate, the growth substrate 201 may be operated through, for example, a laser lift-off process. When the growth substrate 201 is removed, the first buffer layer 210 may be exposed. After removing the growth substrate 201, the first buffer layer 210 may be removed through the etching process. Accordingly, the first semiconductor layer 211 may be exposed to outside.

Figure 9:
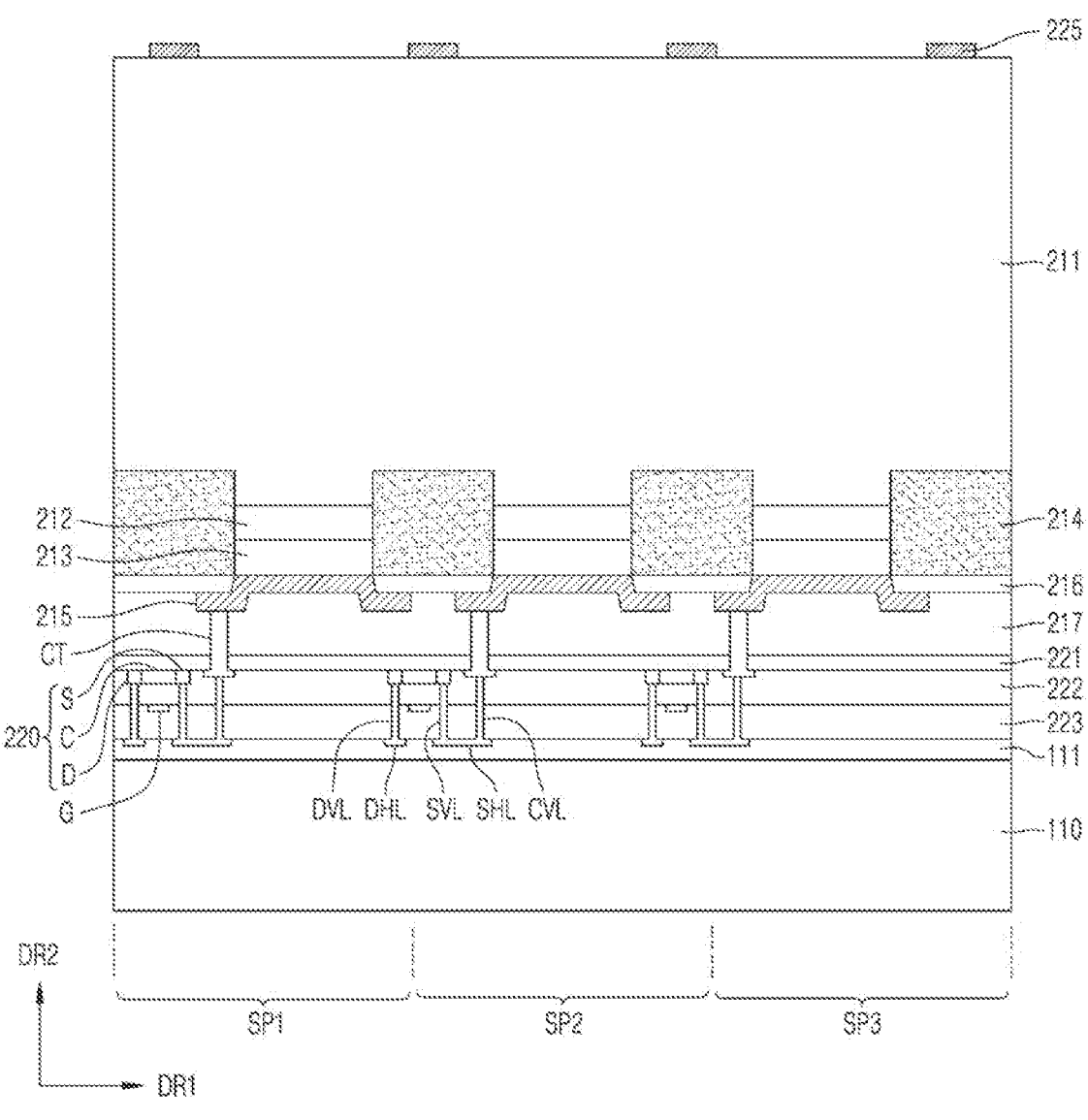

With reference to FIG. 9, a patterned common electrode 225 may be formed on an upper surface of the first semiconductor layer 211 exposed by removing the growth substrate 201. For example, after forming a common electrode film on the upper surface of the first semiconductor layer 211 through the CVD process, the PVD process, or the ALD process, by patterning the common electrode film to partially expose the upper surface of the first semiconductor layer 211, the common electrode 225 may be formed. The common electrode 225 may include, for example, an opaque conductive metallic material.

The common electrode 225 may be arranged at a position overlapping the separation film 214 in the second direction DR2. For example, the common electrode 225 may be arranged to face a central part of the separation film 214 in the second direction DR2. Moreover, a width of the common electrode 225 in the first direction DR1 may be less than or equal to a width of the separation film 214 in the first direction DR1. The drawings illustrate that a plurality of common electrodes 225 are arranged at regular intervals in the first direction DR1; however, the common electrodes 225 may actually be a layer in the mesh shape. Alternatively, separate common electrodes 225 may respectively be arranged for the first to third subpixel areas SP1, SP2 and SP3. A plurality of openings formed to expose the upper surface of the first semiconductor layer 211 may be arranged in a 2D manner on the common electrode 225.

Figure 10:
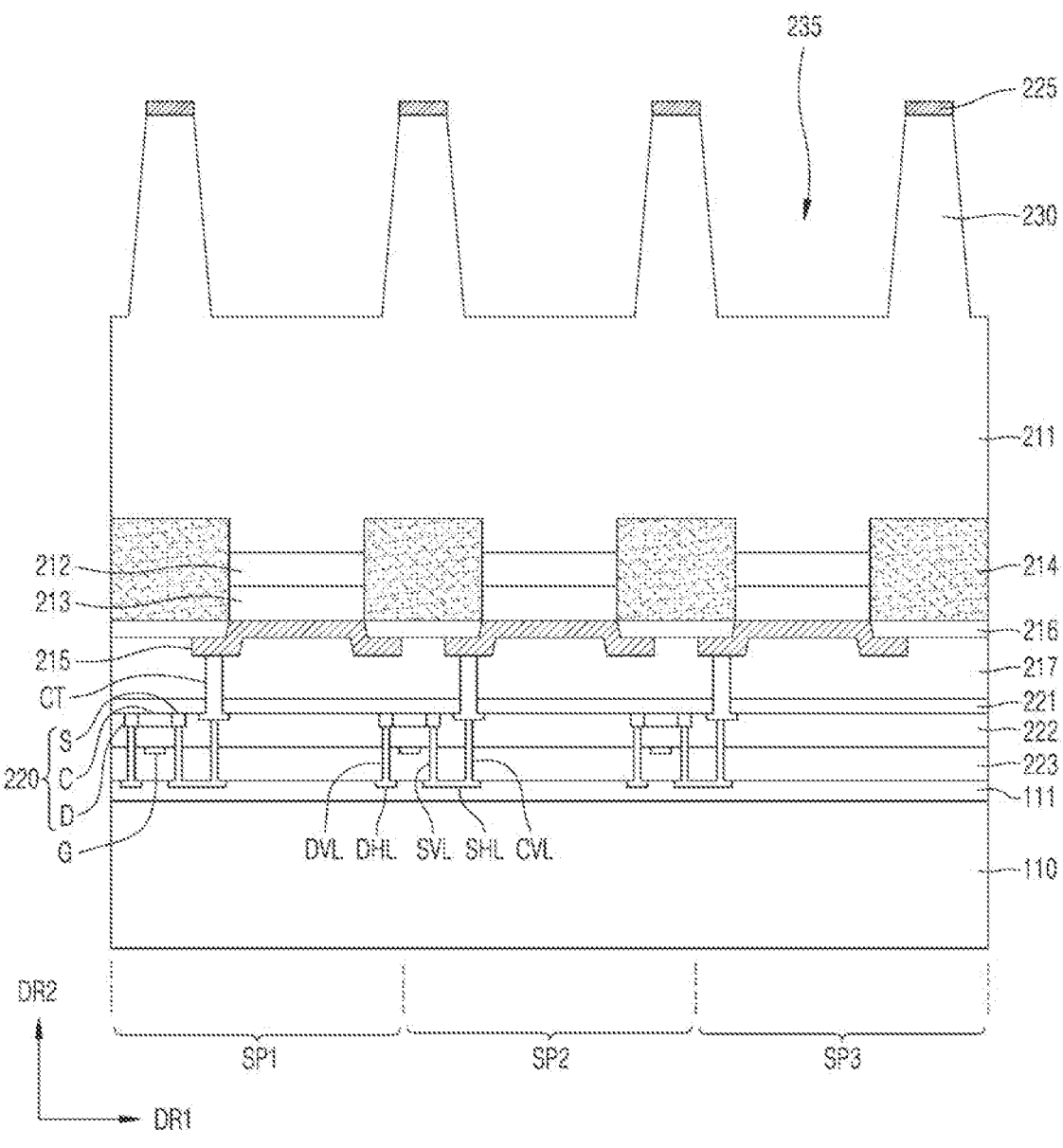

With reference to FIG. 10, between the common electrodes 225, a plurality of partition walls 230 may be formed by etching part of the first semiconductor layer 211, which are not covered by the common electrode 225, may be formed through the dry etching process. The dry etching process may be formed not to completely penetrate the first semiconductor layer 211. Accordingly, a lower portion of the first semiconductor layer 211 may remain after the etching. During the dry etching process, the common electrode 225 may be used as an etching mask, or the dry etching process may be performed after additionally forming an etching mask on the common electrode 225, if needed. The plurality of partition walls 230 formed through the dry etching process may have a width tapering off upwards in the second direction DR2. Accordingly, the plurality of partitions walls 230 may have an inclined lateral surface. The plurality of partitions walls 230 may protrude and extend above the upper surface of the first semiconductor layer 211 in the second direction DR2. The plurality of partition walls 230 may include the same material as the first semiconductor layer 211 and extend from the upper surface of the first semiconductor layer 211 in an integrated manner. The common electrode 225 may be arranged on the upper surface of the plurality of partition walls 230 formed by the etching process.

A plurality of opening areas 235 may be formed between the plurality of partition walls 230. For example, the plurality of opening areas 235 may respectively be formed for the first to third subpixel areas SP1, SP2, and SP3. The plurality of opening areas 235 may respectively face the plurality of active layers 212 in the second direction DR2. Although it is not shown in FIG. 10, the plurality of opening areas 235 may be arranged in a 2D manner as in the plurality of active layers 212. The plurality of opening areas 235 may be formed to be arranged in positions corresponding to the plurality of active layers 212. Accordingly, the plurality of active layers 212 may be arranged on the lower surface of the first semiconductor layer 211 to respectively face the plurality of opening areas 235. Moreover, the plurality of second semiconductor layers 213 may respectively be arranged under the plurality of active layers 212.

Figure 11:
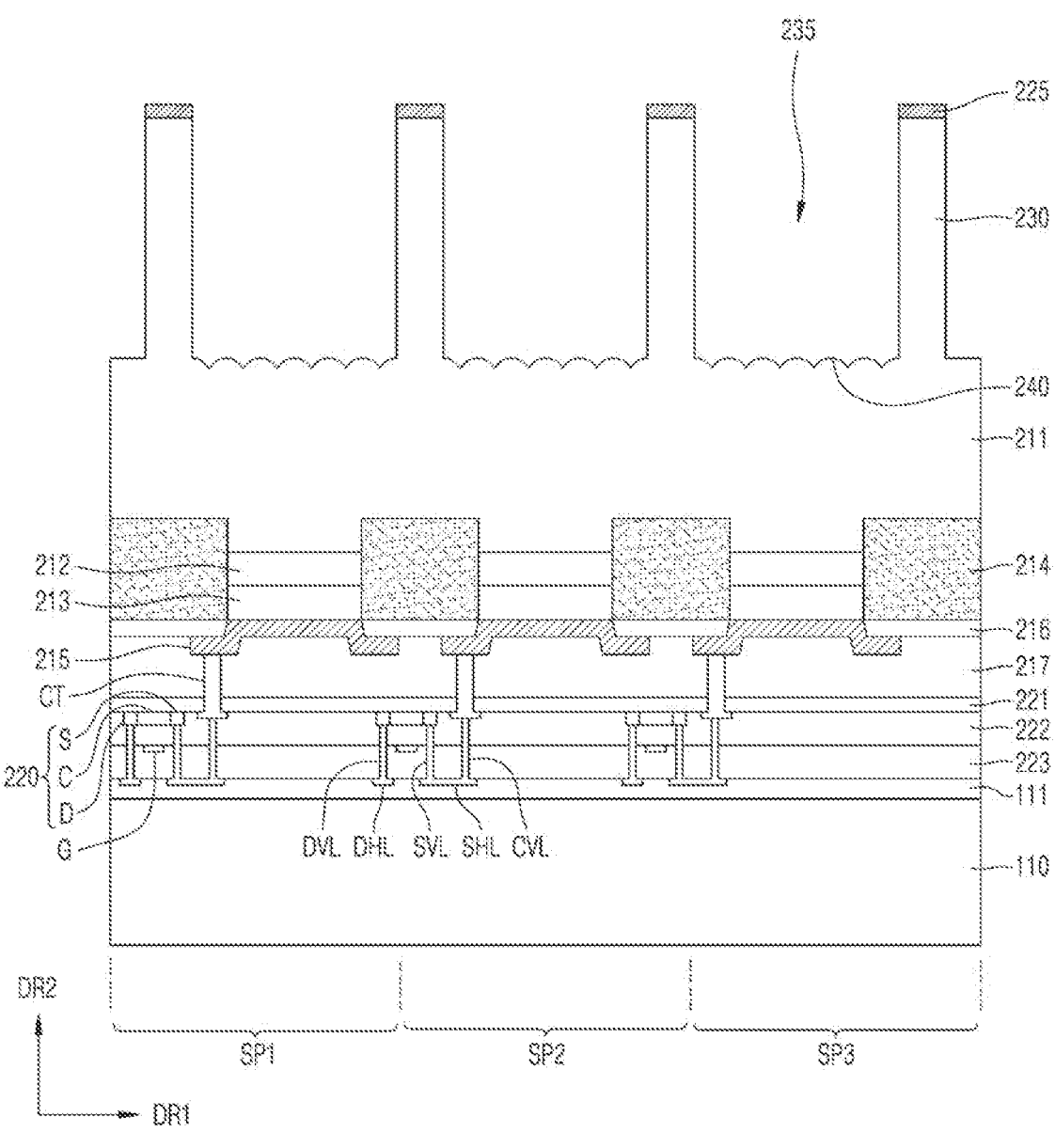

With reference to FIG. 11, through the wet etching process, by increasing an inclination of the inclined lateral surface of the plurality of partitions walls 230, a width of the plurality of partition walls 230 may become relatively regular in the second direction DR2. The wet etching process may be performed by using as an etchant, for example, a potassium hydroxide (KOH) solution, or a tetrammethyl ammonium hydroxide (TMAH) solution. In the plurality partition walls 230 formed according to the aforementioned process, a gap between two adjacent partitions walls 230 in the first direction DR1 may be greater than or equal to a width of each of the plurality of active layers in the first direction DR1.

During the foregoing process, on a bottom surface of the plurality of opening areas 235, that is, the upper surface of the first semiconductor layer 211 in the plurality of opening areas 235, a light extraction pattern 240 having a concavo-convex shape may be formed. The light extraction pattern 240 may be provided in each of the first to third subpixel areas SP1, SP2, and SP3, and face the active layer 212 corresponding to the light extraction pattern 240 in the second direction DR2. The light extraction pattern 240 may facilitate emission of light generated at the active layer 212 to the outside through the opening area 235, which leads to a higher light extraction efficiency. Furthermore, the light emitted to the outside may have a spatially homogeneous intensity distribution by the light extraction pattern 240.

Figure 12:
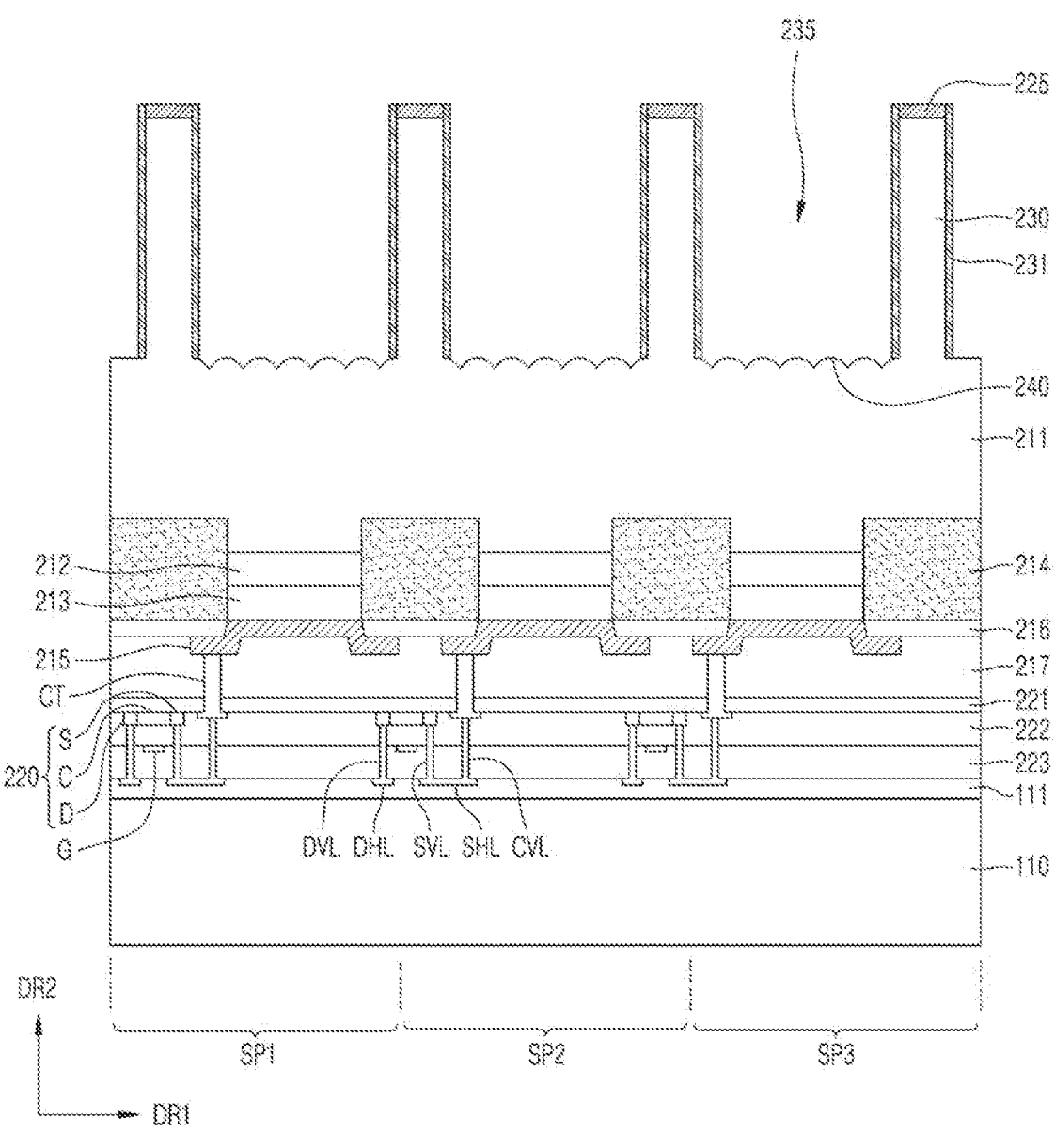

With reference to FIG. 12, a light shielding film 231 may be formed on the lateral surface of the plurality of partition walls 230. For example, the light shielding film 231 may include a light absorbing material or a reflective metallic material. The light shielding film 231 may be formed by forming a light absorbing material or a reflective metallic material to relatively uniformly cover the common electrode 225, the partition wall 230, and the opening area 235, and removing the light absorbing material or the reflective metallic material on the common electrode 225 and the opening areas 235 through the dry etching process.

Figure 13:
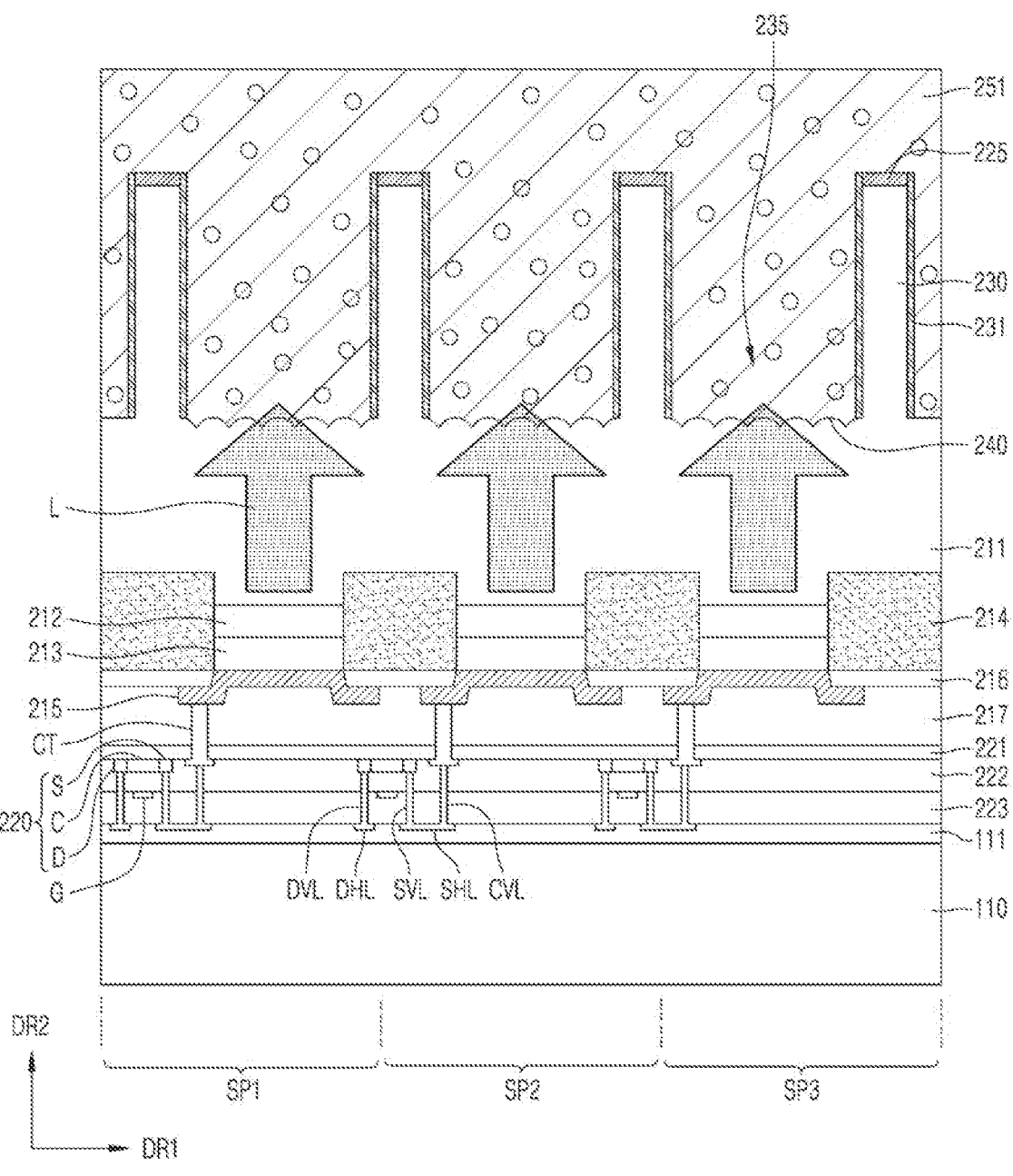

With reference to FIG. 13, a first color conversion layer material 251 may be formed on the plurality of partitions walls 230 and the plurality of opening areas 235. The first color conversion layer material 251 may be formed to cover the common electrode 225, the partition wall 230, and the opening area 235. For example, the first color conversion layer material 251 may be formed by performing a spin coating process or a spray coating process. The first color conversion layer material 251 may fill insides of the plurality of opening areas 235 in the first to third subpixel areas SP1, SP2, and SP3.

The first color conversion layer material 251 may include a quantum dot (QD) or a phosphor excited by blue light and emitting green light. The QD may have a core-shell structure including a core and a shell, or have a particle structure without a shell. The core-shell structure may include a single-shell structure or a multi-shell structure. For example, the multi-shell may be double-shell. In some example embodiments, the QD may include at least one of a group II-VI semiconductor, a group III-V semiconductor, a group IV-VI semiconductor, a group VI semiconductor and/or graphene QD. For example, the QD may include at least one of Cd, Se, Zn, S, ad InP, but the present disclosure is not limited thereto. The QD may have a diameter less than or equal to several tens of nanometers. For example, the diameter of QD may be less than or equal to about 10 nm. Moreover, the first color conversion layer material 251 may further include a photoresist and a light scattering material. The QD or phosphor may be dispersed in the photoresist.

After forming the first color conversion layer material 251, by simultaneously exiting the plurality of active layers 212 in the first to third subpixel areas SP1, SP2, and SP3, light L may be emitted. The light L emitted simultaneously from the plurality of active layers 212 in the first to third subpixel areas SP1, SP2, and SP3 may be irradiated to the first color conversion layer material 251 in the plurality of opening areas 235 of the first to third subpixel areas SP1, SP2, and SP3. The light L may be irradiated to the first color conversion layer material 251 in the opening area 235. For example, by simultaneously applying a voltage to the plurality of reflection electrodes 215 in the first to third subpixel areas SP1, SP2, and SP3, the plurality of active layers 212 in the first to third subpixel areas SP1, SP2, and SP3 may be simultaneously excited. Alternatively, a first voltage may be applied to the common electrode 225 in the first to third subpixel areas SP1, SP2, and SP3, and a ground voltage may be applied to the support substrate 110. The light L emitted from the plurality of active layers 212 may be, for example blue light. The first color conversion layer material 251 in the opening area 235 in the first to third subpixel areas SP1, SP2, and SP3 may be hardened by the light L emitted from the plurality of active layers 212.

Figure 14:
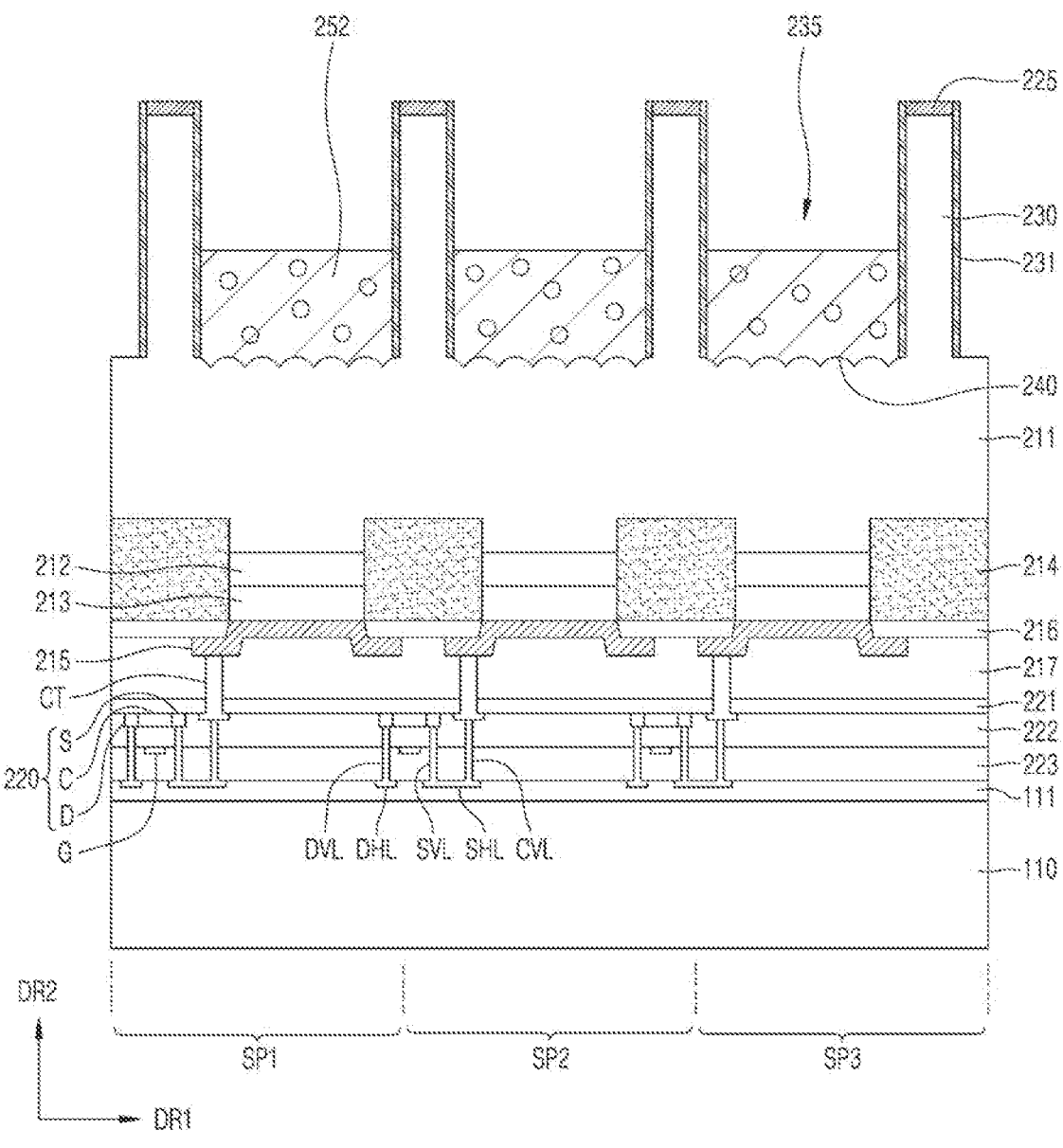

With reference to FIG. 14, by removing a part of the first color conversion layer material 251, which is not hardened, through a developing process, a plurality of first color conversion layers 252 may be respectively formed in each of the plurality of opening areas 235 in the first to third subpixel areas SP1, SP2, and SP3. Each of the plurality of first color conversion layers 252 may fill a portion in each of the plurality opening areas 235. In some example embodiments, the plurality of first color conversion layers 252 may be excited by blue light and emit green light. A height of the plurality of first color conversion layers 252 formed according to the foregoing process may be less than a height of the partition wall 230. For example, by controlling an intensity of the light L and/or an irradiation time of the light L, a thickness of the first color conversion layers 252 may be adjusted.

Figure 15:
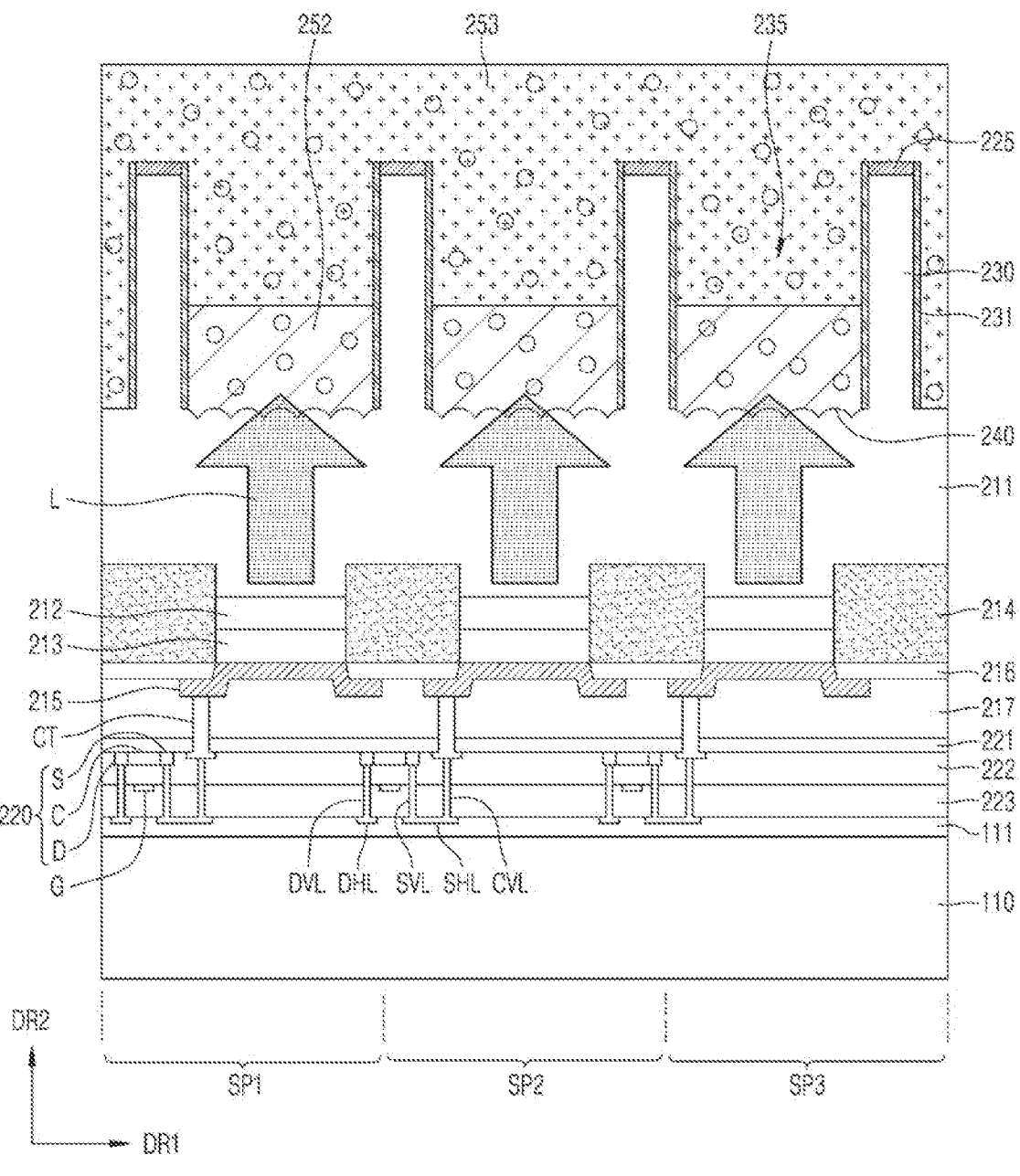

With reference to FIG. 15, a second color conversion layer material 253 may be formed to cover the first color conversion layer 252, the common electrode 252, the partition wall 230, and the opening area 235. For example, the second color conversion layer material 253 may be formed by performing the spin coating process or the spray coating process. The second color conversion layer material 253 may fill another portion in the plurality of opening areas 235 of the first to third subpixel areas SP1, SP2, and SP3. The second color conversion layer material 253 may be excited by blue light and include QDs or a phosphor emitting red light. Furthermore, the second color conversion layer material 253 may include a photoresist or a light scattering agent.

The light L may be emitted by simultaneously exciting the plurality of active layers 212 in the first to third subpixel areas SP1, SP2, and SP3. The light L simultaneously emitted from the plurality of active layers 212 in the first to third subpixel areas SP1, SP2, SP3 may be irradiated to the second color conversion layer material 253 in the plurality of opening areas 235 of the first to third subpixel areas SP1, SP2, and SP3. For example, by simultaneously applying a voltage to the plurality of reflection electrodes 215 in the first to third subpixel areas SP1, SP2, and SP3, the plurality of active layers 212 in the first to third subpixel areas SP1, SP2, and SP3 may be simultaneously excited. Alternatively, the first voltage may be applied to the common electrode 225 in the first to third subpixel areas SP1, SP2, and SP3, the ground voltage may be applied to the support substrate 110. The light L emitted from the plurality of active layers 212 may be, for example, blue light. The second color conversion layer material 253 in the opening area 235 in the first to third subpixel areas SP1, SP2, and SP3 may be hardened by the light L emitted from the plurality of active layers 212.

Figure 16:
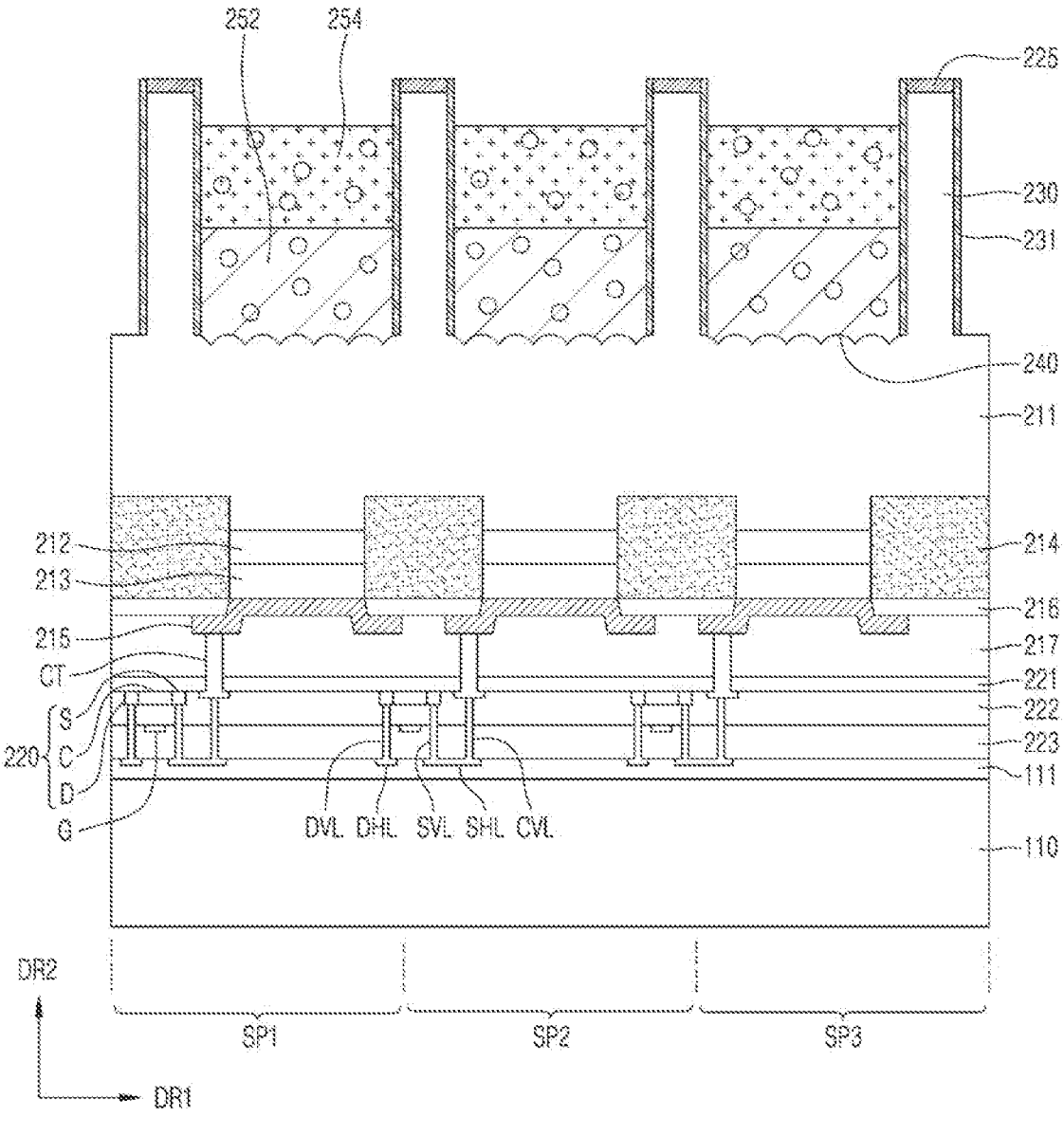

With reference to FIG. 16, by removing a part of the second color conversion layer material 253, which is not hardened, through, for example, the developing process, a plurality of second color conversion layers 254 may be respectively formed in each of the plurality of opening areas 235 in the first to third subpixel areas SP1, SP2, and SP3. Each of the plurality of second color conversion layers 254 may fill a portion in each of the plurality opening areas 235. In some example embodiments, the plurality of second color conversion layers 254 may be excited by blue light and emit red light. A height of the plurality of second color conversion layers 254 formed according to the foregoing process may be less than the height of the partition wall 230. For example, by controlling an intensity of the light L and/or an irradiation time of the light L, the thickness of the second color conversion layer 254 may be adjusted.

A sum of a height of each of the plurality of first color conversion layers 252 and a height of each of the plurality of second color conversion layers 254 may be less than a height of each of the plurality of partition walls 230. For example, by controlling an intensity of the light L and/or an irradiation time of the light L, the thickness of the plurality of first color conversion layer material 252 and the plurality of second color conversion layers 254 may be adjusted.

When the plurality of first color conversion layers 252 and the plurality of second color conversion layers 254 are formed, as the plurality of active layers 212 in the first to third subpixel areas SP1, SP2, and SP3 are simultaneously excited, the designs of the scan driver 102 and the data driver 103 required for operations of the plurality of active layers 212 may be more simplified, compared to the case where the plurality of active layers 212 are selectively driven according to the first to third subpixel areas SP1, SP2, and SP3.

A tandem structure in which the first color conversion layer 252 and the second color conversion layer 254 are stacked in the opening area 235 between two adjacent partition walls among the plurality of partition walls 230 may be provided. In such a case, blue light emitted from the active layer 212 may pass through the first color conversion layer 252 and the second color conversion layer material 253 and be changed to white light. As such, a plurality of color conversion layers having the tandem structure in which the second color conversion layer 254 is stacked on the first color conversion layer 252 may be spaced apart from each other with the plurality of partitions walls 230 arranged therebetween. The plurality of color conversion layers having the tandem structure in which the first color conversion layer 252 and the second color conversion layer 254 are stacked may be arranged to respectively correspond to each of the plurality of light emitting elements including the plurality of first semiconductor layers 211, the plurality of active layers 212, and the plurality of second semiconductor layers 213.

Figure 17:
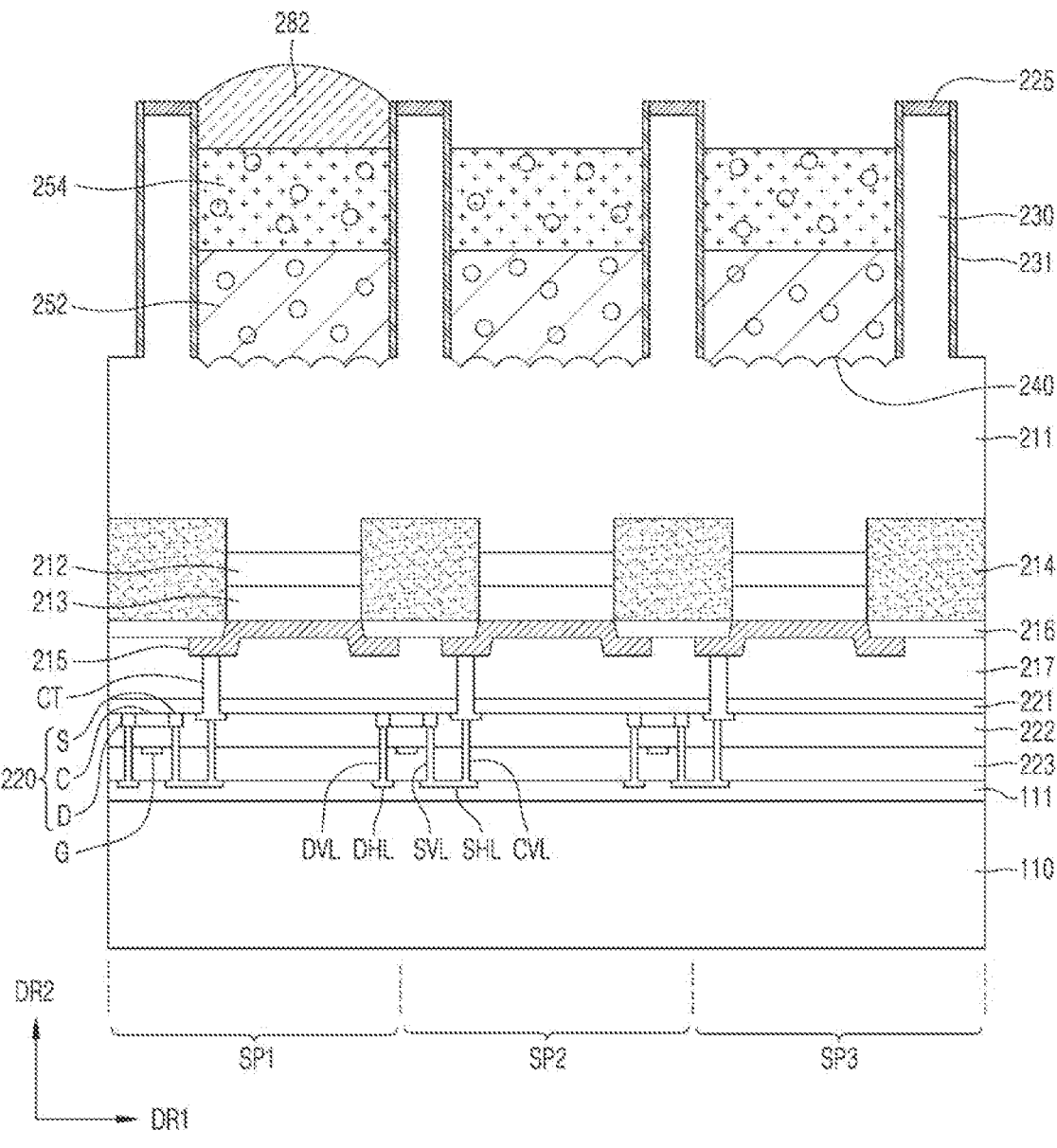

With reference to FIG. 17, in opening area 235 of the first subpixel area SP1, a first color filter 282 may be formed on the first color conversion layer 252 and the second color conversion layer 254. The first color conversion filter 282 may include a red dyestuff which transmits red light and absorbs green light and blue light, a photoresist, and a light scattering agent. The red dyestuff may be dispersed in the photoresist. The first color filter 282 may be formed through a lithography process using a mask.

In the opening area 235 between two adjacent partition walls among the plurality of partition walls 230, the first color conversion layer 252, the second color conversion layer 254, and the first color filter 282 may be arranged. Particularly, the first color filter 282 may be in direct contact with an upper surface of the second color conversion layer 254 corresponding thereto under the first color filter 282. A thickness of the first color filter 282 may be selected so that a sum of a thickness of the first color conversion layer 252, a thickness of the second color conversion layer 254, and the thickness of the first color filter 282 is similar to a thickness of the partition wall 230. The first color filter 282 may be a transflective color filter transmitting red light and absorbing green light and blue light.

The blue light emitted from the active layer 212 may pass through the first color conversion layer 252 and the second color conversion layer 254 and be changed to white light. The white light may pass through the first color filter 282 and be changed to red light. Accordingly, the red light may be emitted from the first subpixel area SP1.

Figure 18:
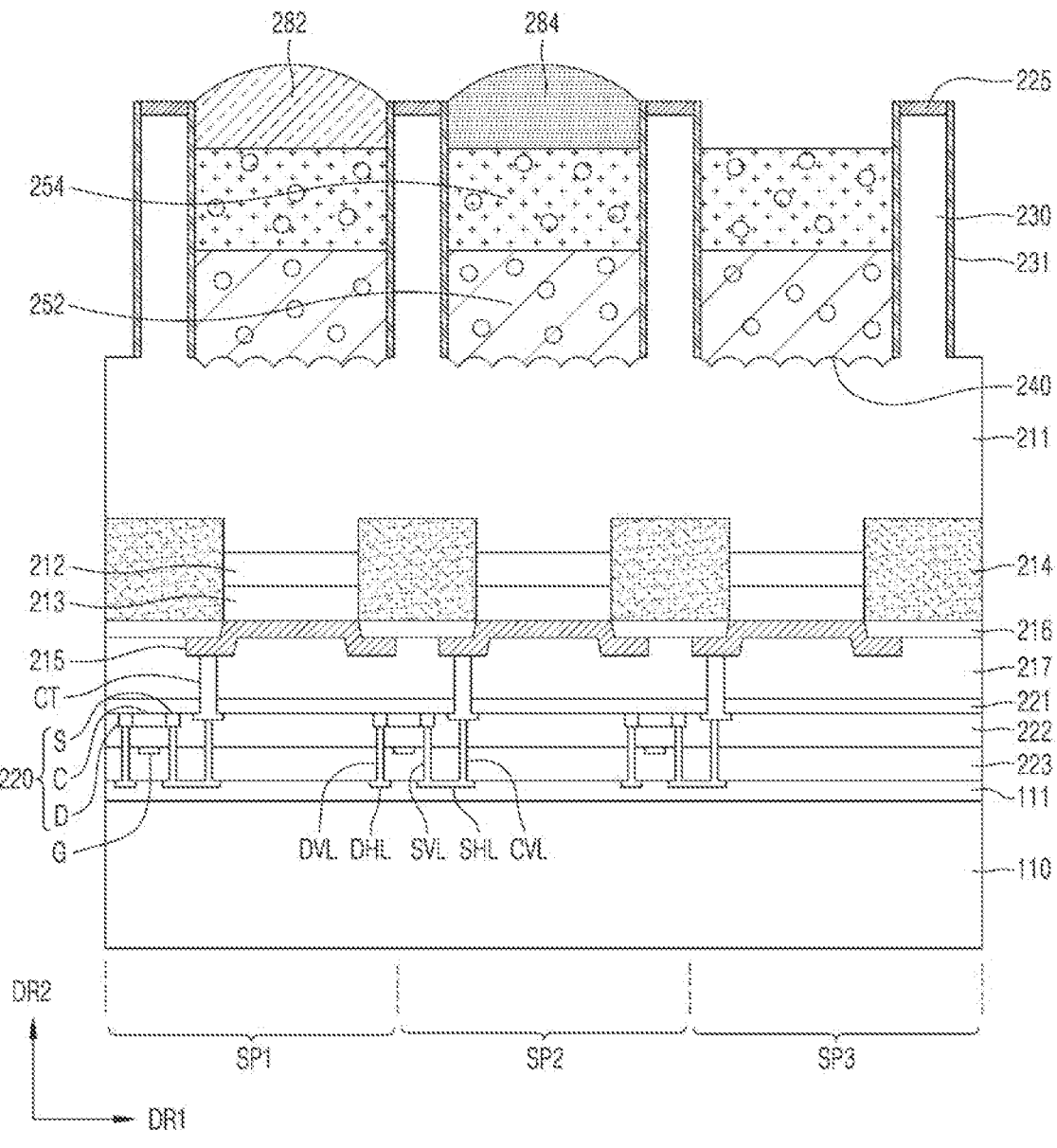

With reference to FIG. 18, in the opening area 235 of the second pixel area SP2, a second color filter 284 may be formed on the first color conversion layer 252 and the second color conversion layer 254. The second color conversion filter 284 may include a blue dyestuff which transmits blue light and absorbs green light and red light, a photoresist, and a light scattering agent. The blue dyestuff may be dispersed in the photoresist. The second color filter 284 may be formed through the lithography process using a mask.

In the opening area 235 between two adjacent partition walls among the plurality of partition walls 230, the first color conversion layer 252, the second color conversion layer 254, and the second color filter 284 may be arranged. Particularly, the second color filter 284 may be in direct contact with the upper surface of the second color conversion layer 254 corresponding thereto under the second color filter 284. A thickness of the second color filter 284 may be selected so that a sum of the thickness of the first color conversion layer 252, the thickness of the second color conversion layer 254, and the thickness of the second color filter 284 is similar to the thickness of the partition wall 230. The second color filter 284 may be a transflective color filter transmitting blue light and absorbing green light and red light.

The blue light emitted from the active layer 212 may pass through the first color conversion layer 252 and the second color conversion layer 254 and be changed to white light. The white light may pass through the second color filter 284 and be changed to blue light. Accordingly, the blue light may be emitted from the second subpixel area SP2.

Figure 19:
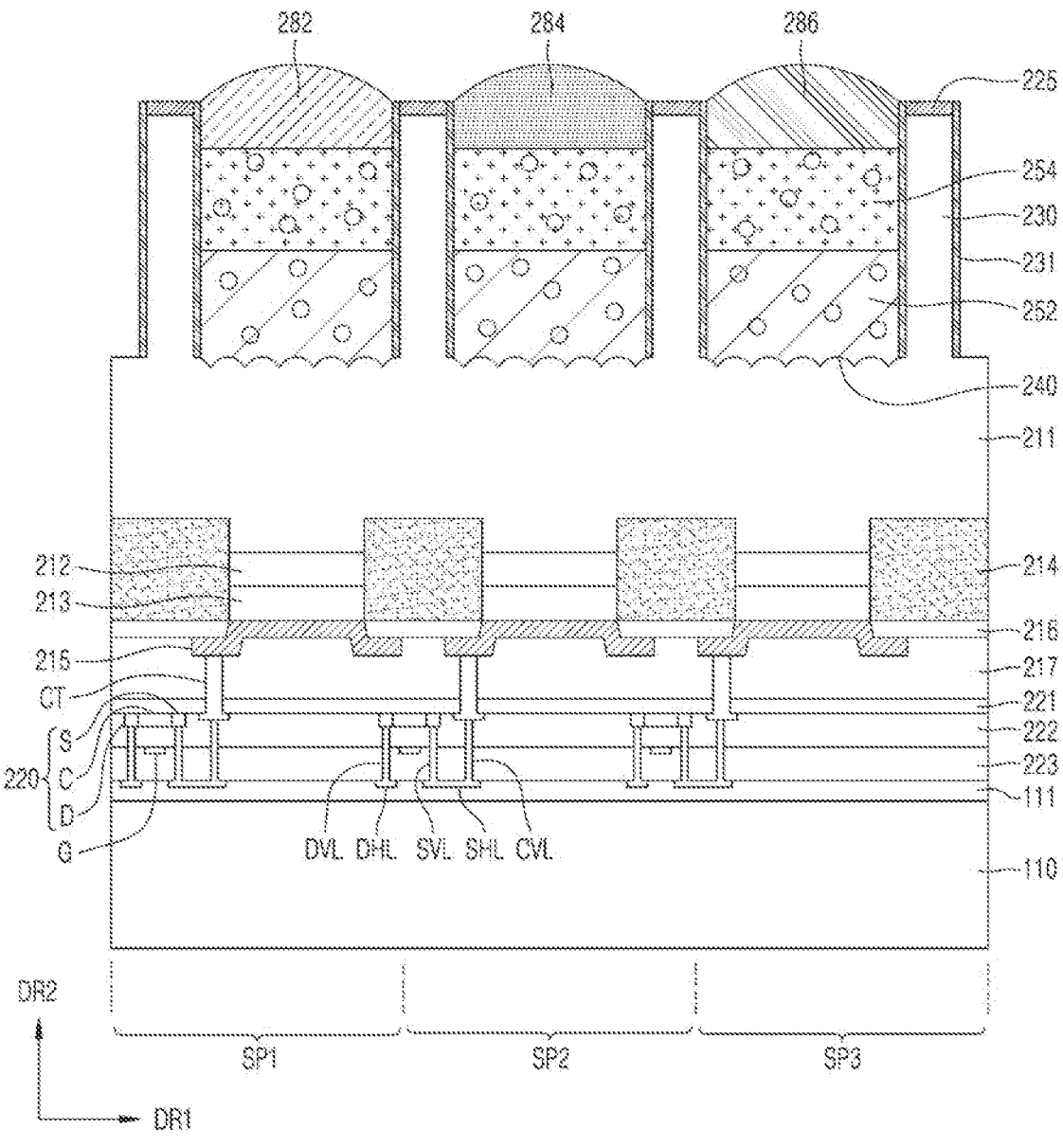

With reference to FIG. 19, in the opening area 235 of the third pixel area SP3, a third color filter 286 may be formed on the first color conversion layer 252 and the second color conversion layer 254. The third color conversion filter 286 may include a green dyestuff which transmits green light and absorbs red light and blue light, a photoresist, and a light scattering agent. The green dyestuff may be dispersed in the photoresist. The third color filter 286 may be formed through the lithography process using a mask.

In the opening area 235 between two adjacent partition walls among the plurality of partition walls 230, the first color conversion layer 252, the second color conversion layer 254, and the third color filter 286 may be arranged. Particularly, the third color filter 286 may be in direct contact with the upper surface of the second color conversion layer 254 corresponding thereto under the third color filter 286. A thickness of the third color filter 286 may be selected so that a sum of the thickness of the first color conversion layer 252, the thickness of the second color conversion layer 254, and the thickness of the third color filter 286 is similar to the thickness of the partition wall 230. The third color filter 286 may be a transflective color filter transmitting green light and absorbing red light and blue light.

The blue light emitted from the active layer 212 may pass through the first color conversion layer 252 and the second color conversion layer 254 and be changed to white light. The white light may pass through the third color filter 286 and be changed to green light. Accordingly, the green light may be emitted from the third subpixel area SP3.

Figure 20:
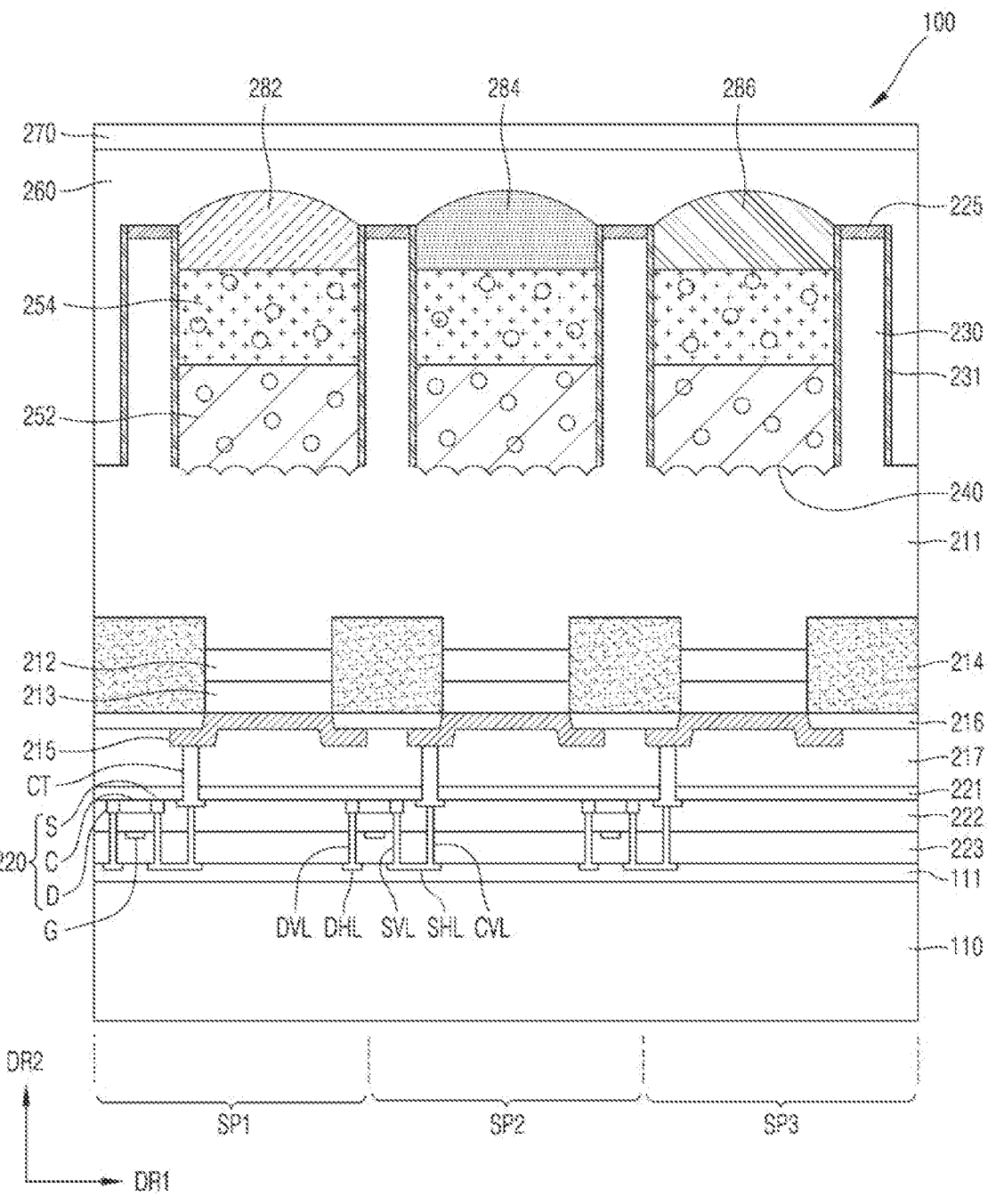

With reference to FIG. 20, a transparent fourth insulating layer 260 may be formed to cover the common electrode 225, the plurality of partition walls 230, the first color filter 282, the second color filter 284, and the third color filter 286. The fourth insulating layer 260 may have a light penetrability with respect to light emitted from the first color conversion layer 252, and the second color conversion layer 254. For example, the fourth insulating layer 260 may include $SiO_2$, $Al_2O_3$, SiN, AlN, or a combination thereof. The fourth insulating layer 260 may have a flat surface extending in the first direction DR1. Moreover, an encapsulation layer 270 may be formed on the fourth insulating layer 260. The encapsulation layer 270 may include an insulating material. For example, the encapsulation layer 270 may include $SiO_2$, $Al_2O_3$, SiN, AlN, or a combination thereof, or include a transparent plastic material or glass.

Through the method described above, the display device 100 according to an example embodiment may be manufactured. According to a method of manufacturing the display device 100 of an example embodiment of the present disclosure, as a light emitting element and a driver circuit are not formed on a growth substrate, no high-level transfer technology is required. Accordingly, expenses and time for manufacturing the display device 100 may be reduced. Furthermore, by using the first semiconductor layer 211 of a light emitting element as the partition wall 230, the first and second color conversion layers 252 and 254 for color implementation may be patterned without the lithography and mask, which leads to further reduction in manufacturing expenses for the display device 100. Moreover, as a structure for preventing light leakage may be easily formed on the partition wall, residues after patterning of the first and second color conversion layers 252 and 254 may hardly remain. Accordingly, the display device 100 may have a high resolution, for example, 5000 ppi (pixel per inch) or higher.

Furthermore, as the thickness of the first and second color conversion layers 252 and 254 may be adjusted by controlling the intensity of the light L and/or the irradiation time of the light L, the first and second color conversion layers 252 and 254 may be easily adjusted. Particularly, the thickness of the first and second color conversion layers 252 and 254 may be adjusted differently in consideration of a desired color purity. Accordingly, the color purity of the display device 100 may be improved.

Figure 21:
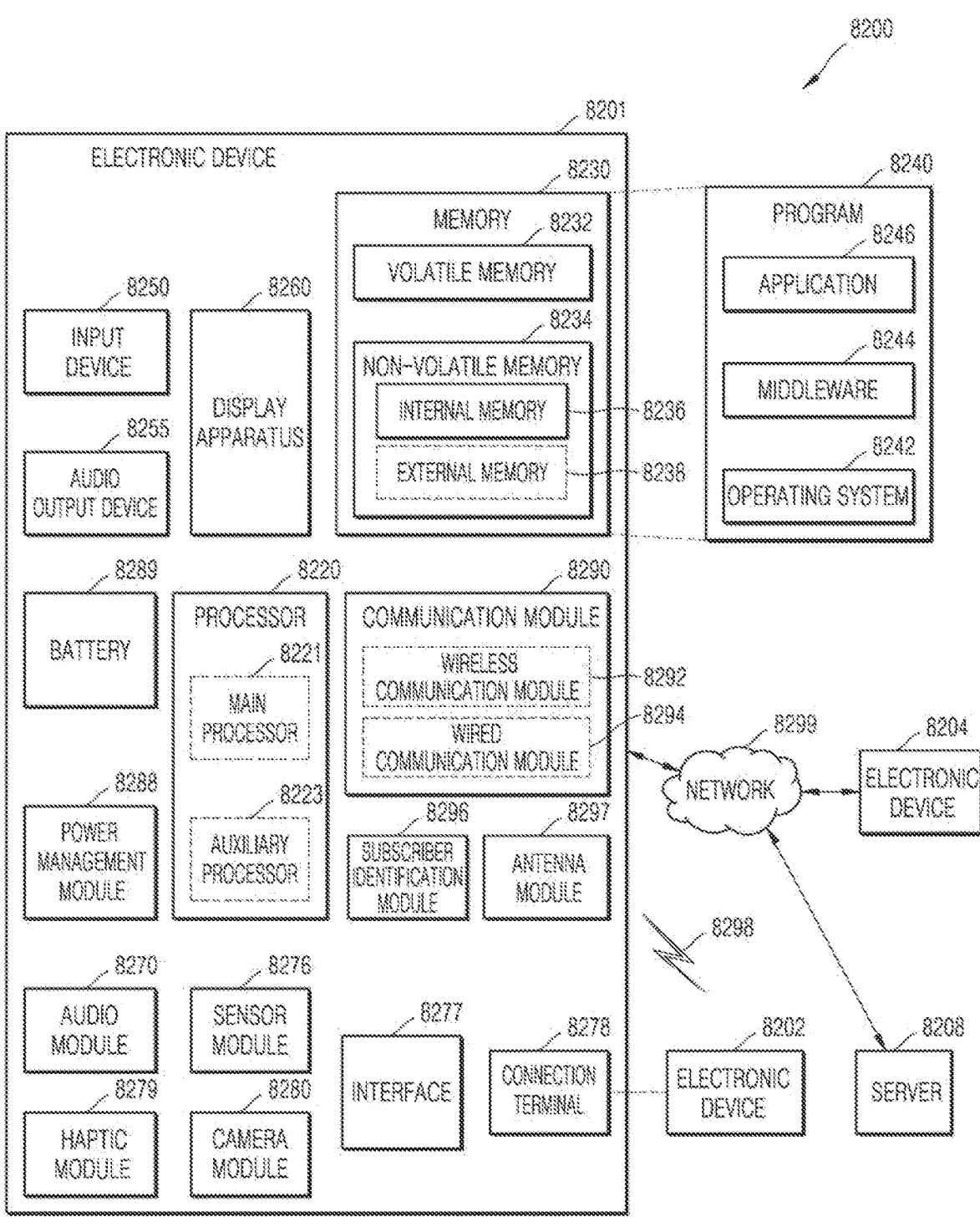
FIG. 21 is a schematic block diagram of an electronic device according to an example embodiment.

The display device 100 may be applied to various electronic devices having the screen display function. FIG. 21 is a schematic block diagram of an electronic device according to an example embodiment. With reference to FIG. 21, an electronic device 8201 may be provided in a network environment 8200. In the network environment 8200, the electronic device 8201 may communicate with another electronic device 8202 through a first network 8298 (a short-range wireless communication network, etc.) or communicate with another electronic device 8204 and/or a server 8208 through a second network 8299 (a long-distance wireless communication network, etc.). The electronic device 8201 may communicate with the electronic device 8204 through the server 8208. The electronic device 8201 may include a processor 8220, a memory 8230, an input device 8250, an audio output device 8255, a display device 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. In the electronic device 8201, some of constituent elements may be omitted or other constituent elements may be added. Some of the constituent elements may be implemented by one integrated circuit. For example, the sensor module 8276 (a fingerprint sensor, an iris sensor, an illuminance sensor, and the like) may be implemented by being embedded in the display device 8260 (a display, and the like).

The processor 8220 may control one or a plurality of other constituent elements (hardware and software constituent elements, and the like) of the electronic device 8201 connected to the processor 8220 by executing software (a program 8240, and the like), and perform various data processing or calculations. As part of the data processing or calculations, the processor 8220 may load, in a volatile memory 8232, commands and/or data received from other constituent elements (the sensor module 8276, the communication module 8290, and the like), process the command and/or data stored in the volatile memory 8232, and store result data in a non-volatile memory 8234. The non-volatile memory 8234 may include an internal memory 8236 fixedly installed in the electronic device 8201 and an external memory 8238 that is removable. The processor 8220 may include a main processor 8221 (a central processing unit, an application processor, and the like) and an auxiliary processor 8223 (a graphics processing unit, an image signal processor, a sensor hub processor, a communication processor, and the like) that is operable independently of or together with the main processor 8221. The auxiliary processor 8223 may use less power than the main processor 8221 and may perform a specialized function.

Instead of the main processor 8221 when the main processor 8221 is in an inactive state (sleep state), or with the main processor 8221 when the main processor 8221 is in an active state (application execution state), the auxiliary processor 8223 may control functions and/or states related to some constituent elements (the display device 8260, the sensor module 8276, the communication module 8290, and the like) of the constituent elements of the electronic device 8201. The auxiliary processor 8223 (an image signal processor, a communication processor, and the like) may be implemented as a part of functionally related other constituent elements (the camera module 8280, the communication module 8290, and the like).

The memory 8230 may store various data needed by the constituent elements (the processor 8220, the sensor module 8276, and the like) of the electronic device 8201. The data may include, for example, software (the program 8240, and the like) and input data and/or output data about commands related thereto. The memory 8230 may include the volatile memory 8232 and/or the non-volatile memory 8234.

The program 8240 may be stored in the memory 8230 as software, and may include an operating system 8242, middleware 8244, and/or an application 8246.

The input device 8250 may receive commands and/or data to be used for constituent elements (the processor 8220, and the like) of the electronic device 8201, from the outside (a user, and the like) of the electronic device 8201. The input device 8250 may include a remote controller, a microphone, a mouse, a keyboard, and/or a digital pen (a stylus pen, and the like).

The audio output device 8255 may output an audio signal to the outside of the electronic device 8201. The audio output device 8255 may include a speaker and/or a receiver. The speaker may be used for general purposes such as multimedia playback or recording playback, and the receiver can be used to receive incoming calls. The receiver may be implemented by being coupled as a part of the speaker or by an independent separate device.

The display device 8260 may visually provide information to the outside of the electronic device 8201. The display device 8260 may include a display, a hologram device, or a projector, and a control circuit to control a corresponding device. The display device 8260 may be the display device 100 having the structure described above. The display device 8260 may include a touch circuitry set to detect a touch and/or a sensor circuit (a pressure sensor, and the like) set to measure the strength of a force generated by the touch.

The audio module 8270 may convert sound into electrical signals or reversely electrical signals into sound. The audio module 8270 may obtain sound through the input device 8250, or output sound through a speaker and/or a headphone of another electronic device (the electronic device 8202, and the like) connected to the audio output device 8255 and/or the electronic device 8201 in a wired or wireless manner.

The sensor module 8276 may detect an operation state (power, temperature, and the like) of the electronic device 8201, or an external environment state (a user state, and the like), and generate an electrical signal and/or a data value corresponding to a detected state. The sensor module 8276 may include a gesture sensor, a gyro sensor, a barometric pressure sensor, a magnetic sensor, an acceleration sensor, a grip sensor, a proximity sensor, a color sensor, an IR sensor, a biometric sensor, a temperature sensor, a humidity sensor, and/or an illuminance sensor.

The interface 8277 may support one or more specified protocols used for the electronic device 8201 to be connected to another electronic device (the electronic device 8202, and the like) in a wired or wireless manner. The interface 8277 may include a high-definition multimedia interface (HDMI), a universal serial bus (USB) interface, an SD card interface, and/or an audio interface.

A connection terminal 8278 may include a connector for the electronic device 8201 to be physically connected to another electronic device (the electronic device 8202, and the like). The connection terminal 8278 may include an HDMI connector, a USB connector, an SD card connector, and/or an audio connector (a headphone connector, and the like).

The haptic module 8279 may convert electrical signals into mechanical stimuli (vibrations, movements, and the like) or electrical stimuli that are perceivable by a user through tactile or motor sensations. The haptic module 8279 may include a motor, a piezoelectric device, and/or an electrical stimulation device.

The camera module 8280 may capture a still image and a video. The camera module 8280 may include a lens assembly including one or more lenses, image sensors, image signal processors, and/or flashes. The lens assembly included in the camera module 8280 may collect light emitted from a subject for image capturing.

The power management module 8288 may manage power supplied to the electronic device 8201. The power management module 8288 may be implemented as a part of a power management integrated circuit (PMIC).

The battery 8289 may supply power to the constituent elements of the electronic device 8201. The battery 8289 may include non-rechargeable primary cells, rechargeable secondary cells, and/or fuel cells.

The communication module 8290 may establish a wired communication channel and/or a wireless communication channel between the electronic device 8201 and another electronic device (the electronic device 8202, the electronic device 8204, the server 8208, and the like), and support a communication through an established communication channel. The communication module 8290 may be operated independent of the processor 8220 (the application processor, and the like), and may include one or more communication processors supporting a wired communication and/or a wireless communication. The communication module 8290 may include a wireless communication module 8292 (a cellular communication module, a short-range wireless communication module, a global navigation satellite system (GNSS) communication module, and the like), and/or a wired communication module 8294 (a local area network (LAN) communication module, a power line communication module, and the like). Among the above communication modules, a corresponding communication module may communicate with another electronic device through the first network 8298 (a short-range communication network such as Bluetooth, WiFi Direct, or infrared data association (IrDA)) or the second network 8299 (a long-range communication network such as a cellular network, the Internet, or a computer network (LAN, WAN, and the like)). These various types of communication modules may be integrated into one constituent element (a single chip, and the like), or may be implemented as a plurality of separate constituent elements (multiple chips). The wireless communication module 8292 may verify and authenticate the electronic device 8201 in a communication network such as the first network 8298 and/or the second network 8299 by using subscriber information (an international mobile subscriber identifier (IMSI), and the like) stored in the subscriber identification module 8296.

The antenna module 8297 may transmit signals and/or power to the outside (another electronic device, and the like) or receive signals and/or power from the outside. An antenna may include an emitter formed in a conductive pattern on a substrate (a printed circuit board (PCB), and the like). The antenna module 8297 may include one or a plurality of antennas. When the antenna module 8297 includes a plurality of antennas, the communication module 8290 may select, from among the antennas, an appropriate antenna for a communication method used in a communication network such as the first network 8298 and/or the second network 8299. Signals and/or power may be transmitted or received between the communication module 8290 and another electronic device through the selected antenna. Other parts (an RFIC, and the like) than the antenna may be included as a part of the antenna module 8297.

Some of the constituent elements may be connected to each other through a communication method between peripheral devices (a bus, general purpose input and output (GPIO), a serial peripheral interface (SPI), a mobile industry processor interface (MIPI), and the like) and may mutually exchange signals (commands, data, and the like).

The command or data may be transmitted or received between the electronic device 8201 and the external electronic device 8204 through the server 8208 connected to the second network 8299. The electronic devices 8202 and 8204 may be of a type that is the same as or different from the electronic device 8201. All or a part of operations executed in the electronic device 8201 may be executed in one or more electronic devices (8202, 8204, and 8208). For example, when the electronic device 8201 needs to perform a function or service, the electronic device 8201 may request one or more electronic devices to perform part of the whole of the function or service, instead of performing the function or service. The one or more electronic devices receiving the request may perform additional function or service related to the request, and transmit a result of the performance to the electronic device 8201. To this end, cloud computing, distributed computing, and/or client-server computing technology may be used.

Figure 22:
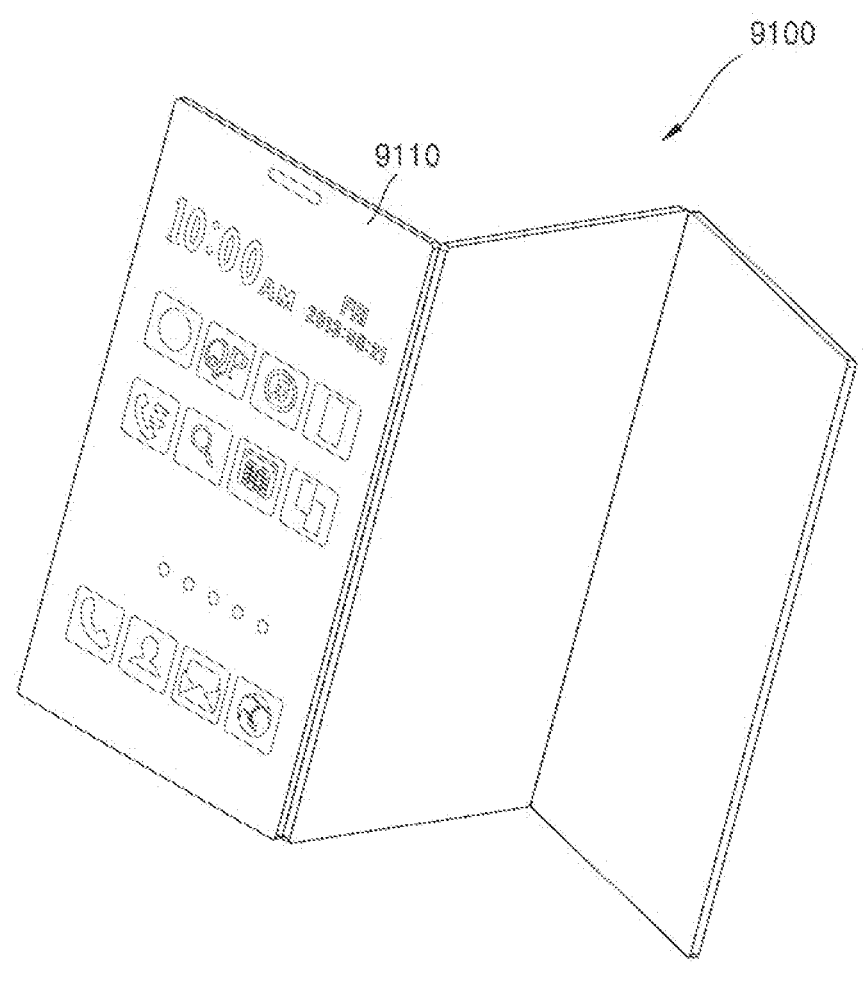
FIG. 22 is a diagram illustrating an example of a display device applied to a mobile device according to some example embodiments.

FIG. 22 is a diagram illustrating an example of a display device applied to a mobile device according to some example embodiments. A mobile device 9100 may include a display device 9110, and the display device 9110 may be the display device 100 having the structure described above. The display device 9110 may have a foldable structure, for example, a multi-foldable structure.

Figure 23:
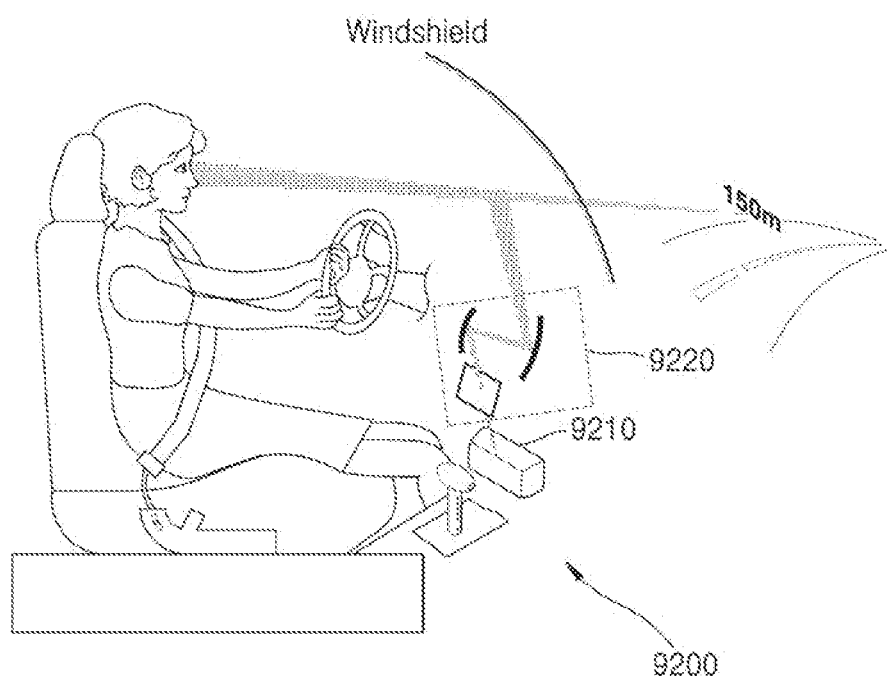
FIG. 23 is a diagram illustrating an example of a display device applied to a mobile device for vehicles according to some example embodiments.

FIG. 23 is a diagram illustrating an example of a display device applied to a mobile device for vehicles according to some example embodiments. The display device for vehicles may be a head-up display device for vehicle 9200 and may include a display device 9210 and an optical path change member 9220 configured to change an optical path so that a driver can see an image generated at the display device 9210. The display device 9210 may be the display device 100 having the structure described above.

Figure 24:
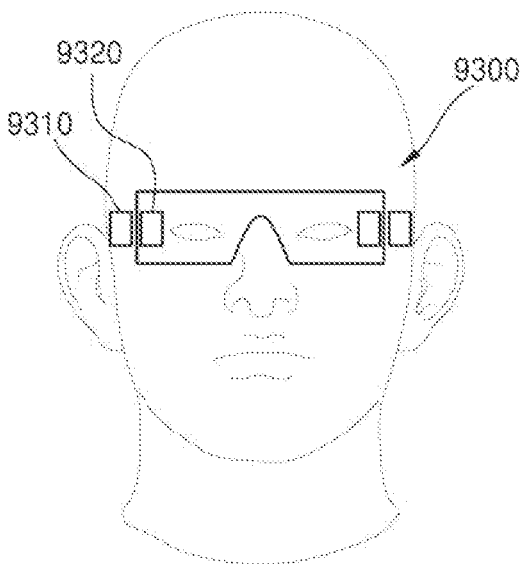
FIG. 24 is a diagram illustrating an example of a display device applied to augmented reality glasses or virtual reality glasses according to some example embodiments.

FIG. 24 is a diagram illustrating an example of a display device applied to augmented reality glasses or virtual reality glasses according to some example embodiments. An augmented reality device 9300 in the shape of glasses may include a projection system 9310 including a display device and configured to generate an image, and an optical system 9320 configured to guide the image from the projection system 9310 to user's eyes. The projection system 9310 may include the display device 100 having the structure described above.

Figure 25:
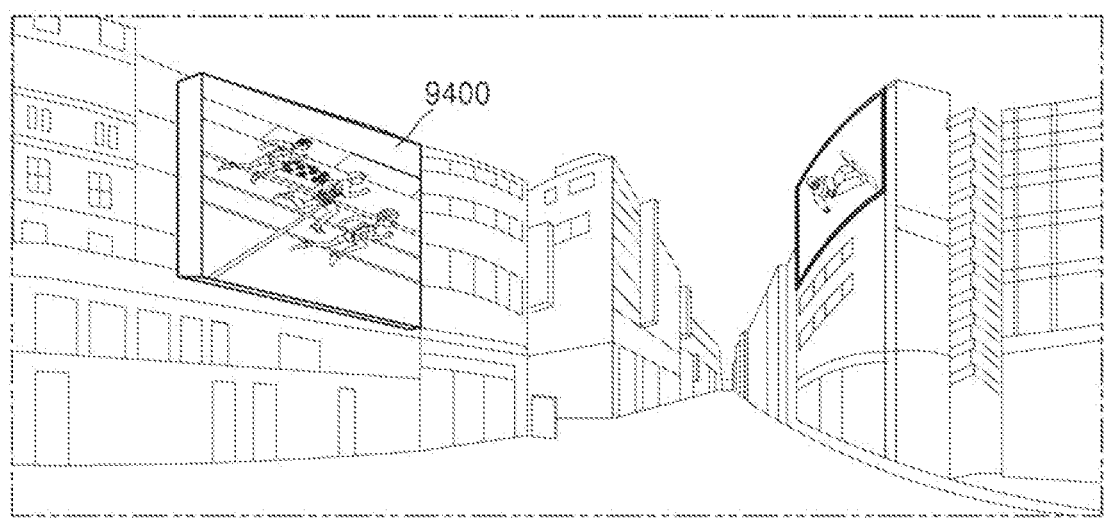
FIG. 25 is a diagram illustrating an example of a display device applied to signage according to some example embodiments.

FIG. 25 is a diagram illustrating an example of a display device applied to signage according to some example embodiments. A signage 9400 may be used in outdoor advertising using a digital information display, and may control contents, etc. of an advertisement though a network. The signage 9400 may be implemented by, for example, the electronic device described with reference to FIG. 28.

Figure 26:
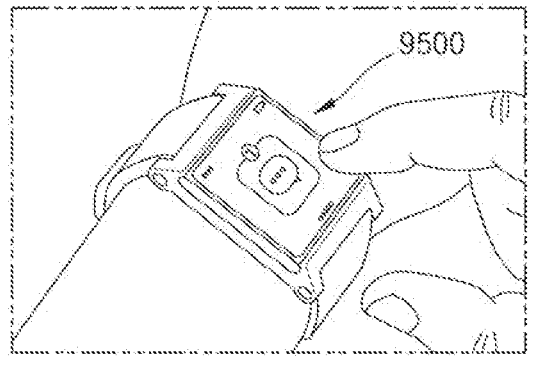
FIG. 26 is a diagram illustrating an example of a display device applied to a wearable display according to some example embodiments.

FIG. 26 is a diagram illustrating an example of a display device applied to a wearable display according to some example embodiments. A wearable display 9500 may be the display device 100 having the structure described above, and may be implemented by the electronic device described with reference to FIG. 28.

The display device according to an example embodiment may also be applied to various products such as rollable TV, stretchable display, etc.

According to a method of manufacturing a display device of an example embodiment of the present disclosure, as a light emitting element and a driver circuit are not formed on a growth substrate, no high-level transfer technology is required. Accordingly, expenses and time for manufacturing a display device may be reduced. Furthermore, by using a semiconductor layer of a light emitting element as a partition wall, a color conversion layer for color implementation may be patterned without a mask, which leads to further reduction in manufacturing expenses for display device. Moreover, as a structure for preventing light leakage is easily formed on the partition wall, residues after patterning of the color conversion layer and color filter may be minimized.

According to a method of manufacturing a display device of an example embodiment, by employing a method of simultaneously operating a plurality of active layers in the process of patterning the light conversion layer and the color filter without using a mask, designs of a scan driver and a data driver required for control of operations of the plurality of active layers may be simplified.

It should be understood that example embodiments described herein should be considered in a descriptive sense only and not for purposes of limitation. Descriptions of features or aspects within each example embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims.

What is claimed is:

1. A display device comprising:
a plurality of light emitting elements including a first semiconductor layer, each of the plurality of light emitting elements including a second semiconductor layer provided under the first semiconductor layer and an active layer between the first semiconductor layer and the second semiconductor layer;
a plurality of partition walls extending from the first semiconductor layer; and
a plurality of color conversion layers provided on the plurality of light emitting elements in correspondence with the plurality of light emitting elements and spaced apart from each other by the plurality of partition walls, each of the plurality of color conversion layers including a first color conversion layer and a second color conversion layer stacked on the first color conversion layer,
wherein the first semiconductor layer includes an upper surface, a lower surface opposite to the upper surface, the plurality of partition walls protruding and extending from the upper surface, and a plurality of opening areas provided between the plurality of partition walls, and
wherein a material of the plurality of partition walls is the same as a material of the first semiconductor layer, and the plurality of partition walls extend in an integrated manner from the upper surface of the first semiconductor layer.

2. The display device of claim 1, wherein the active layer of each of the plurality of light emitting elements faces a corresponding opening area of the plurality of opening areas on the lower surface of the first semiconductor layer, and in each of the plurality of light emitting elements, the second semiconductor layer is provided under the active layer.

3. The display device of claim 1, further comprising a plurality of separation films respectively provided between active layers of adjacent light emitting elements of the plurality of light emitting elements and between second semiconductor layers of the adjacent light emitting elements.

4. The display device of claim 1, wherein the first color conversion layer of each of the plurality of color conversion layers is provided in a corresponding opening area of the plurality of opening areas on the upper surface of the first semiconductor layer, and the second color conversion layer of each of the plurality of color conversion layers is provided on the corresponding first color conversion layer and includes a material different from that of the first color conversion layer.

5. The display device of claim 1, further comprising a common electrode provided on an upper surface of each of the plurality of partition walls.

6. The display device of claim 5, wherein the common electrode includes an opaque metallic material.

7. The display device of claim 1, further comprising a light shielding film provided on lateral surfaces of the plurality of partition walls.

8. The display device of claim 1, wherein, in the plurality of opening areas, the upper surface of the first semiconductor layer has a light extraction pattern.

9. The display device of claim 1, further comprising a plurality of reflection electrodes respectively electrically connected to the second semiconductor layer of each of the plurality of light emitting elements.

10. The display device of claim 1, wherein the first semiconductor layer is doped with a dopant having a first conductivity type, and the second semiconductor layer of each of the plurality of light emitting elements is doped with a dopant having a second conductivity type which is electrically opposite to the first conductivity type.

11. The display device of claim 1, wherein a distance between two adjacent partition walls of the plurality of partition walls is greater than a width of the active layer of each of the plurality of light emitting elements.

12. The display device of claim 1, wherein a width of the active layer of each of the plurality of light emitting elements is between 0.1 µm and 100 µm.

13. The display device of claim 1, wherein a sum of a height of the first color conversion layer of each of the plurality of color conversion layers and a height of the second color conversion layer of each of the plurality of color conversion layers is less than a height of each of the plurality of partition walls.

14. The display device of claim 1, wherein each of the first color conversion layer of each of the plurality of color conversion layers and the second color conversion layer of each of the plurality of color conversion layers includes a photoresist and quantum dots or phosphors dispersed in the photoresist.

15. The display device of claim 1, further comprising a plurality of color filters respectively provided on the plurality of color conversion layers.

16. The display device of claim 15, further comprising an insulating layer covering each of the plurality of color filters and having a light penetrability with respect to light emitted from the plurality of color conversion layers.

17. The display device of claim 1, further comprising a switching circuit configured to simultaneously operate at least a portion of active layers of the plurality of light emitting elements.

18. The display device of claim 1, wherein the active layer emits blue light and the blue light passing through the first color conversion layer and the second color conversion layer is changed to white light.

19. An augmented reality device comprising:
   a projection system including a display configured to generate an image; and
   an optical system configured to guide the image generated from the projection system to eyes of a user, wherein the display includes:
   a plurality of light emitting elements including a first semiconductor layer, each of the plurality of light emitting elements including a second semiconductor layer provided under the first semiconductor layer and an active layer between the first semiconductor layer and the second semiconductor layer;
   a plurality of partition walls extending from the first semiconductor layer; and
   a plurality of color conversion layers provided on the plurality of light emitting elements in correspondence with the plurality of light emitting elements and spaced apart from each other by the plurality of partition walls, each of the plurality of color conversion layers including a first color conversion layer and a second color conversion layer stacked on the first color conversion layer,
   wherein the first semiconductor layer includes an upper surface, a lower surface opposite to the upper surface, the plurality of partition walls protruding and extending from the upper surface, and a plurality of opening areas provided between the plurality of partition walls, and
   wherein a material of the plurality of partition walls is the same as a material of the first semiconductor layer, and the plurality of partition walls extend in an integrated manner from the upper surface of the first semiconductor layer.

* * * * *